US010038065B2

(12) United States Patent
Xie et al.

(10) Patent No.: US 10,038,065 B2
(45) Date of Patent: Jul. 31, 2018

(54) METHOD OF FORMING A SEMICONDUCTOR DEVICE WITH A GATE CONTACT POSITIONED ABOVE THE ACTIVE REGION

(71) Applicant: GLOBALFOUNDRIES Inc., Grand Cayman (KY)

(72) Inventors: Ruilong Xie, Niskayuna, NY (US);
Chanro Park, Clifton Park, NY (US);
Min Gyu Sung, Latham, NY (US);
Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/639,095

(22) Filed: Jun. 30, 2017

(65) Prior Publication Data
US 2017/0309714 A1     Oct. 26, 2017

Related U.S. Application Data

(63) Continuation of application No. 14/887,927, filed on Oct. 20, 2015, now Pat. No. 9,735,242.

(51) Int. Cl.
*H01L 29/417* (2006.01)
*H01L 29/41* (2006.01)
(Continued)

(52) U.S. Cl.
CPC .... *H01L 29/41775* (2013.01); *H01L 27/0886* (2013.01); *H01L 29/0649* (2013.01);
(Continued)

(58) Field of Classification Search
CPC ................... H01L 29/41775; H01L 29/41783
See application file for complete search history.

(56) References Cited

U.S. PATENT DOCUMENTS 4,692,349 A    9/1987 Georgiou et al.
6,018,185 A *  1/2000 Mitani ............ H01L 21/28518
                                             257/374
(Continued)

OTHER PUBLICATIONS

Office Action from related U.S. Appl. No. 14/927,765 dated May 20, 2016.
(Continued)

*Primary Examiner* — Tom Thomas
*Assistant Examiner* — Vincent Wall
(74) *Attorney, Agent, or Firm* — Amerson Law Firm, PLLC

(57) ABSTRACT

One illustrative method disclosed includes, among other things, forming an initial conductive source/drain structure that is conductively coupled to a source/drain region of a transistor device, performing a recess etching process on the initial conductive source/drain structure to thereby define a stepped conductive source/drain structure with a cavity defined therein, forming a non-conductive structure in the cavity, forming a layer of insulating material above the gate structure, the stepped conductive source/drain structure and the non-conductive structure, forming a gate contact opening in the layer of insulating material and forming a conductive gate contact in the gate contact opening that is conductively coupled to the gate structure.

20 Claims, 26 Drawing Sheets

(51) Int. Cl.
*H01L 29/06* (2006.01)
*H01L 29/08* (2006.01)
*H01L 29/45* (2006.01)
*H01L 27/088* (2006.01)
*H01L 27/02* (2006.01)

(52) U.S. Cl.
CPC .......... *H01L 29/0847* (2013.01); *H01L 29/41* (2013.01); *H01L 29/41766* (2013.01); *H01L 29/41783* (2013.01); *H01L 29/45* (2013.01); *H01L 27/0207* (2013.01)

(56) References Cited

U.S. PATENT DOCUMENTS

| | | | |
|---|---|---|---|
| 6,225,663 | B1 | 5/2001 | Yamaguchi et al. |
| 6,346,438 | B1 * | 2/2002 | Yagishita ........ H01L 21/823418 257/E21.433 |
| 6,566,718 | B2 | 5/2003 | Wieczorek et al. |
| 8,557,666 | B2 | 10/2013 | Wei et al. |
| 8,703,556 | B2 | 4/2014 | Kelly et al. |
| 8,765,546 | B1 | 7/2014 | Hung et al. |
| 9,024,388 | B2 | 5/2015 | Choi et al. |
| 9,147,748 | B1 * | 9/2015 | Xie ................... H01L 29/66545 |
| 2004/0087148 | A1 | 5/2004 | Wong |
| 2009/0212433 | A1 | 8/2009 | Yang et al. |
| 2011/0147765 | A1 | 6/2011 | Huang et al. |
| 2012/0104512 | A1 | 5/2012 | Horak et al. |
| 2012/0107970 | A1 | 5/2012 | Takaki |
| 2013/0175583 | A1 * | 7/2013 | Yuan ..................... H01L 23/485 257/288 |
| 2013/0187203 | A1 | 7/2013 | Xie et al. |
| 2013/0248950 | A1 | 9/2013 | Kang et al. |
| 2013/0334651 | A1 | 12/2013 | Doris et al. |
| 2014/0110798 | A1 | 4/2014 | Cai et al. |
| 2014/0308794 | A1 | 10/2014 | Lee et al. |
| 2015/0076609 | A1 * | 3/2015 | Xie ....................... H01L 29/785 257/365 |
| 2015/0091100 | A1 | 4/2015 | Xie et al. |
| 2015/0108589 | A1 | 4/2015 | Cheng et al. |
| 2016/0049487 | A1 | 2/2016 | Xu et al. |
| 2016/0079354 | A1 | 3/2016 | Park et al. |
| 2016/0133623 | A1 * | 5/2016 | Xie ....................... H01L 27/088 257/384 |

OTHER PUBLICATIONS

Final Office Action from related U.S. Appl. No. 14/927,765 dated Nov. 17, 2016.
Office Action from related U.S. Appl. No. 14/927,765 dated May 2, 2017.

* cited by examiner

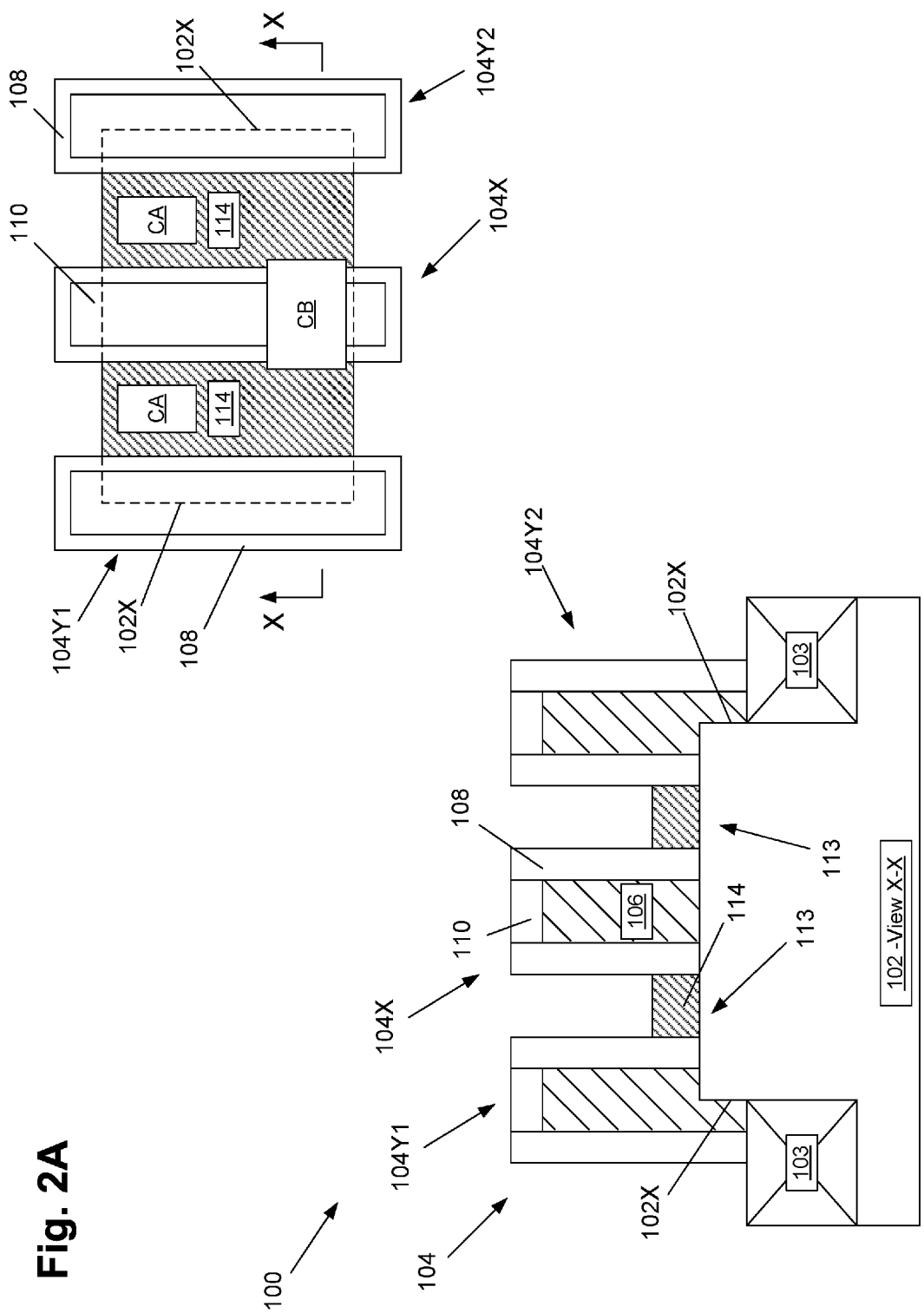

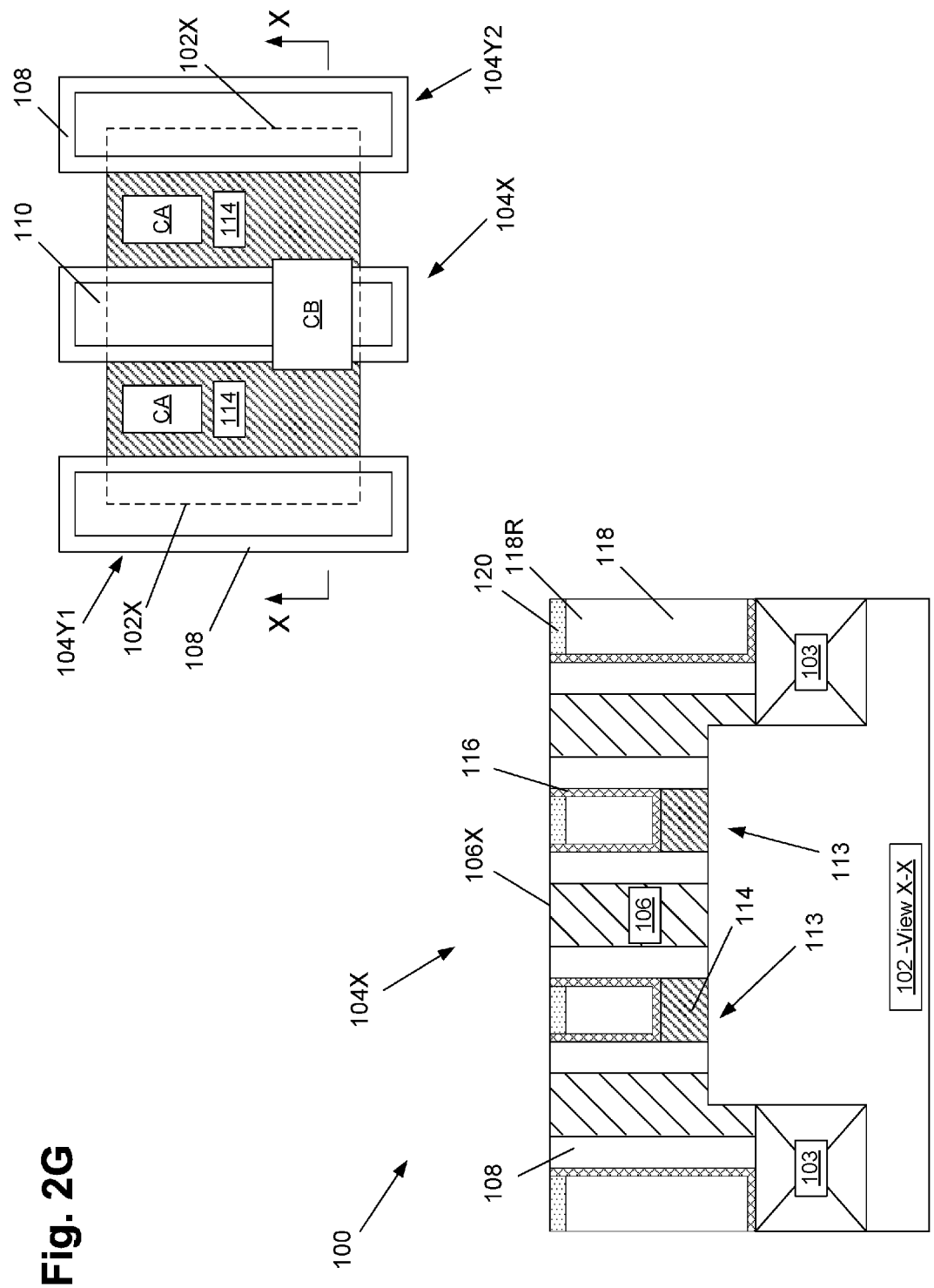

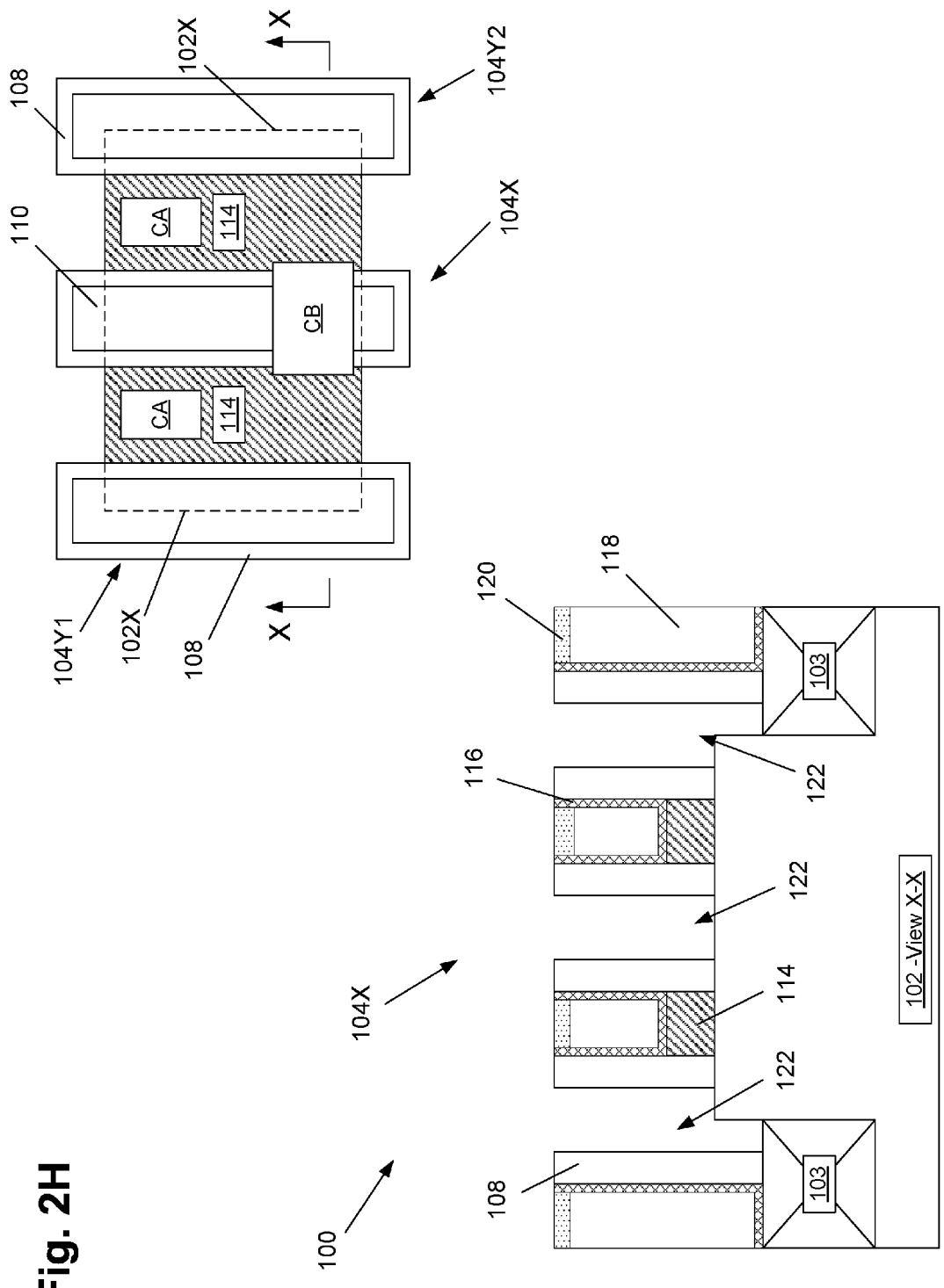

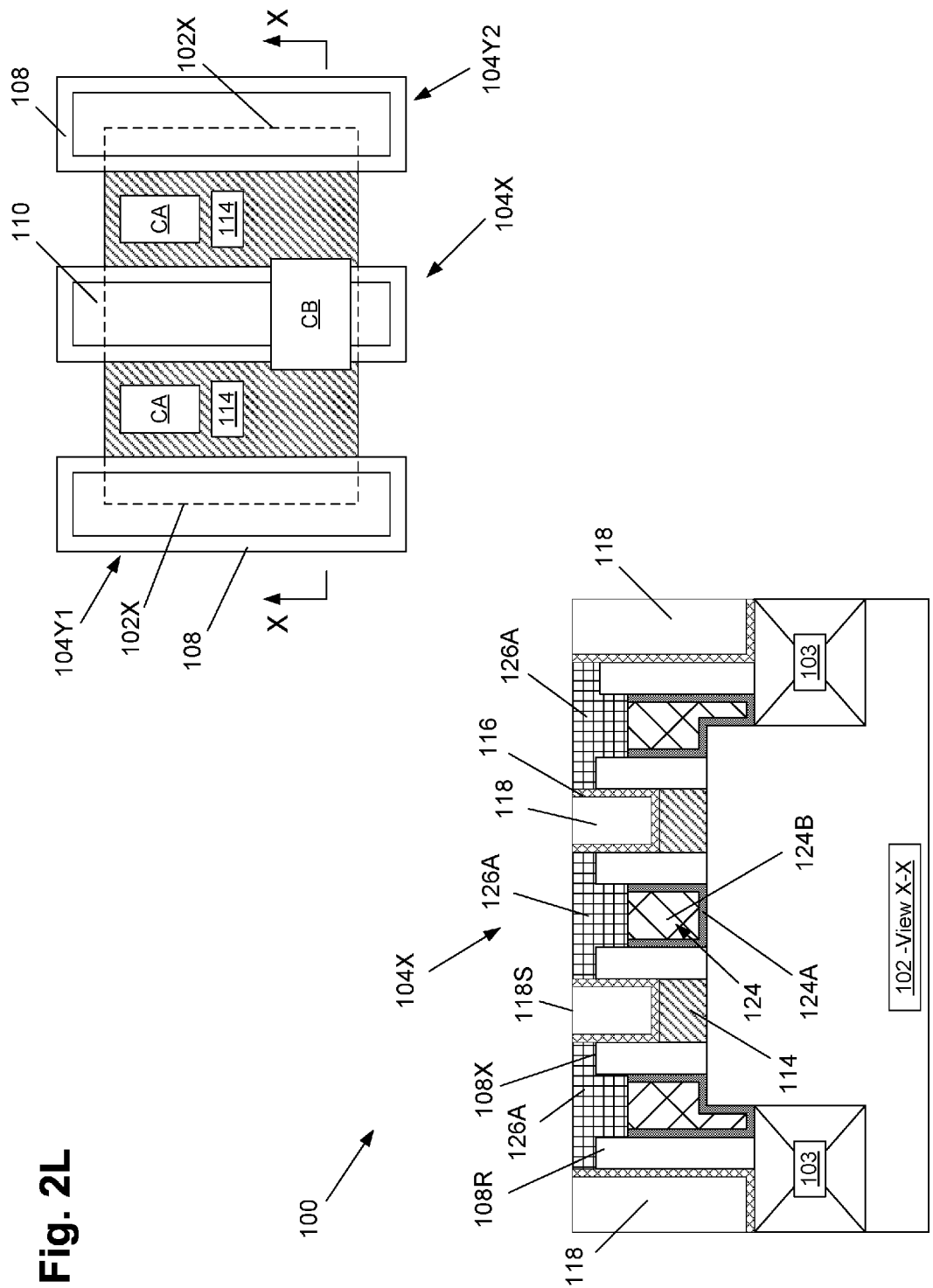

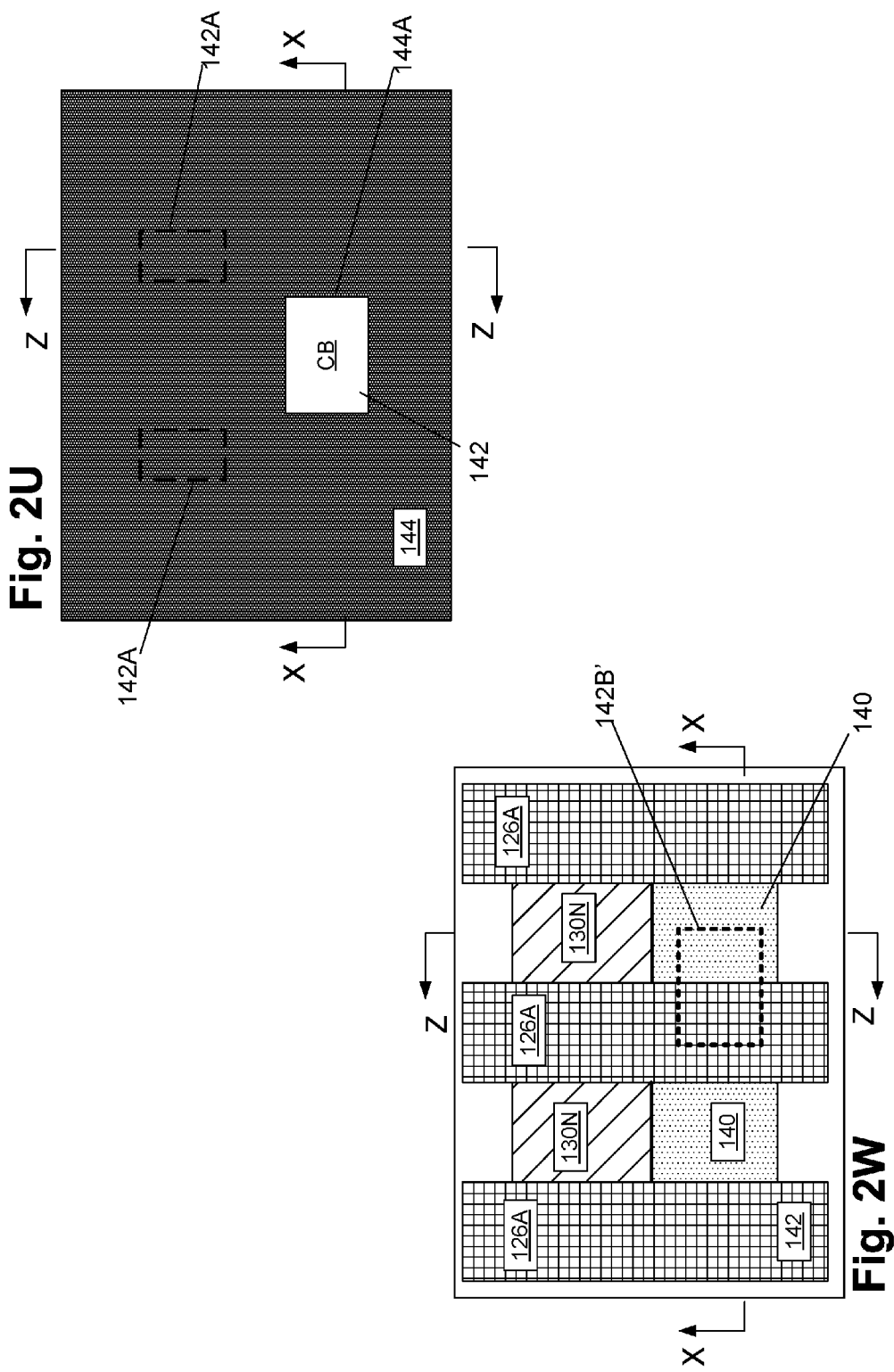

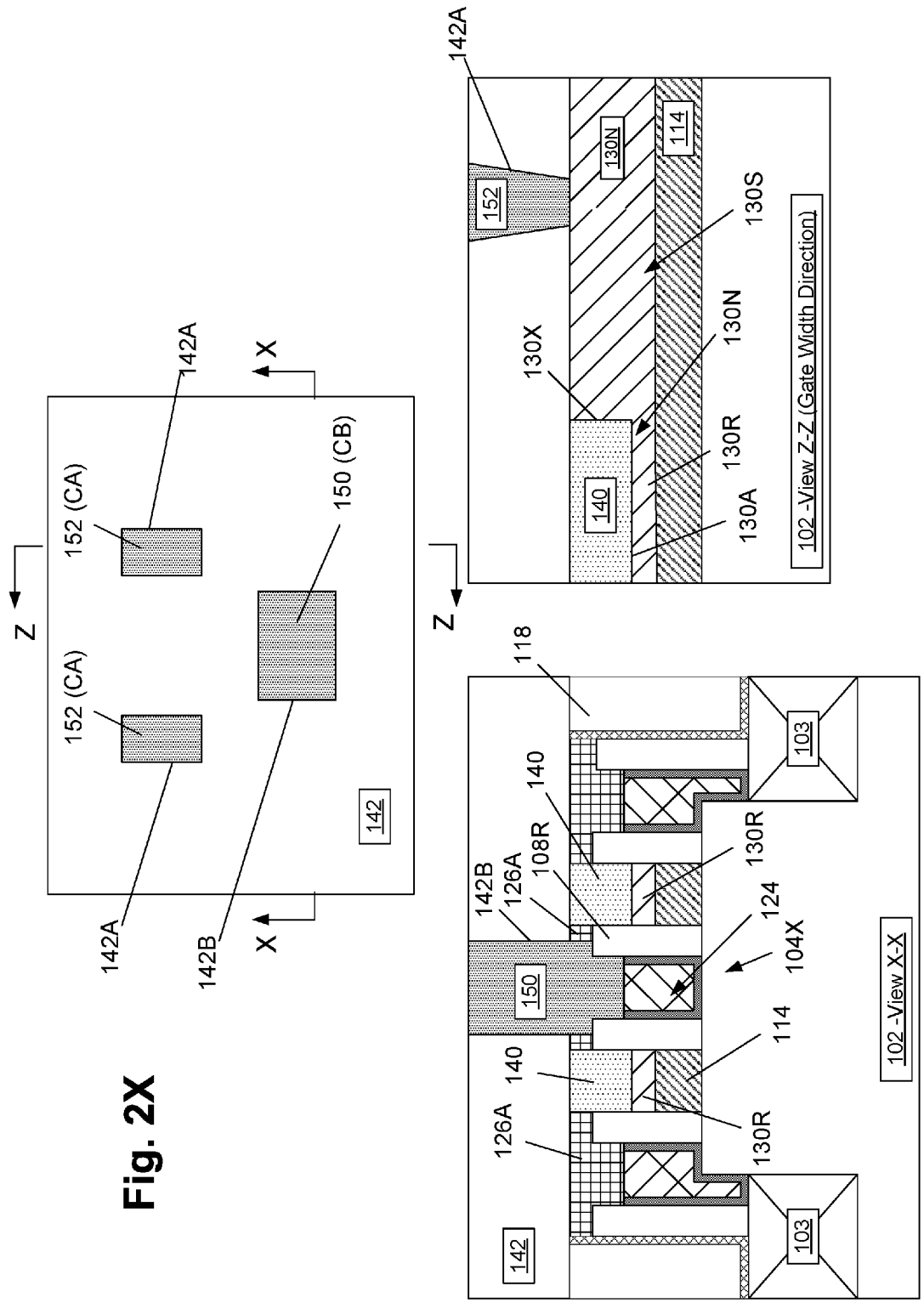

METHOD OF FORMING A SEMICONDUCTOR DEVICE WITH A GATE CONTACT POSITIONED ABOVE THE ACTIVE REGION

BACKGROUND OF THE INVENTION

1. Field of the Invention

The present disclosure generally relates to the fabrication of integrated circuits, and, more particularly, to a method of forming a semiconductor device with a gate contact positioned above the active region.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. Trenches 22 are formed in the substrate 12 to define the fins 14. A recessed layer of insulating material (not shown) is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1B is a cross-sectional view of an illustrative integrated circuit product 10A comprised of a plurality of transistor devices 15 formed in and above a semiconductor substrate 12A. A schematically depicted isolation region 13 has also been formed in the substrate 12A. In the depicted example, the transistor devices 15 are comprised of an illustrative gate structure, i.e., a gate insulation layer 15A and a gate electrode 15B, a gate cap layer 21, a sidewall spacer 23 and simplistically depicted source/drain regions 25. At the point of fabrication depicted in FIG. 1B, layers of insulating material 17A, 17B, i.e., interlayer dielectric materials, have been formed above the product 10A. Other layers of material, such as contact etch stop layers and the like, are not depicted in the attached drawings. Also depicted are illustrative raised epi source drain regions 25X and source/drain contact structures 27 which include a combination of a so-called "trench silicide" (TS) structure 29 and a so-called "CA contact" structure 31. Also depicted is a gate contact structure 33 which is sometimes referred to as a "CB contact" structure. The CB contact 33 is formed so as to contact a portion of the gate electrode 15B of one of the transistors 15. In a plan view, the CB gate contact 33 is positioned vertically above the isolation region 13 that surrounds the product 10A, i.e., the CB gate contact 33 is not positioned above the active region defined in the substrate 12A. The CA contact structures 31 may be in the form of discrete contact elements, i.e., one or more individual contact plugs having a generally square-like or cylindrical shape, that are formed in an interlayer dielectric material, as shown in FIG. 1B. In other applications (not shown in FIG. 1B), the CA contact structures 31 may also be a line-type feature that contacts underlying line-type features, e.g., the TS structure 29 that contacts the source/drain region 25, 25X and typically extends across the entire active region on the source/drain region 25. Also depicted in FIG. 1B is the first metallization layer—the so-called M1 layer—of the multi-level metallization system for the product 10A that is formed in a layer of insulating material 35, e.g., a low-k insulating material. A plurality of conductive vias—so-called V0 vias 37—are provided to establish electrical connection between the device-level contacts—CA contacts 31 and the CB contact 33—and the M1 layer. The M1 layer typically includes a plurality of metal lines 39 that are routed as needed across the product 10A.

In one embodiment, the process flow of forming the TS structures 29, CA contacts 31 and CB contacts 33 may be as follows. After the first layer of insulating material 17A is deposited, TS openings are formed in the first layer of insulating material 17A that expose portions of underlying source/drain regions 25, 25X. Thereafter, traditional silicide is formed through the TS openings, followed by forming tungsten (not separately shown) on the metal silicide regions, and performing a chemical mechanical polishing (CMP) process down to the top of the gate cap layer 21. Then, the second layer of insulating material 17B is deposited and contact openings for the CA contacts 31 are formed in the second layer of insulating material 17B that expose portions of the underlying tungsten metallization above the source/drain regions 25. Next, while the opening for the CA contacts 31 is masked, the opening for the CB contact 33 is formed in the second layer of insulating material 17B and through the gate cap layer 21 so as to expose a portion of the gate electrode 15B. Typically, the CB contact 33 is in the form of a round or square plug. Thereafter, the conductive CA contacts 31 and the conductive CB contact 33 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 31 and CB contact 33 typically contain a uniform body of metal, e.g., tungsten, and may also include one or more metallic barrier layers (not shown) positioned between the uniform body of metal and the layer of insulating material 17B. The source/drain contact structures 27 (TS contacts 29, CA contacts 31) and the CB contact 33 are all considered to be device-level contacts within the industry.

FIG. 1C is a simplistic plan view of an illustrative FinFET device comprised of three illustrative fins 41. Also depicted are illustrative CA contacts 31, a CB contact 33, a gate cap layer 21, sidewall spacers 23 and the trench silicide (TS) structures 29 formed above the source/drain regions 25. As noted above, the CB gate contact 33 is positioned vertically above the isolation region 13 that surrounds the product 10A, i.e., the CB gate contact 33 is not positioned above the active region defined in the substrate 12A. The CB gate contact 33 is positioned above the isolation region 13 so as to avoid or reduce the chances of creating an electrical short between the CB contact 33 and the TS structure 29, i.e., there is a minimum spacing 43 that must be maintained between these two structures according to various design rules in an attempt to prevent such electrical shorts. Unfortunately, there is an area penalty associated with the requirement that the CB contact 33 only be positioned above the isolation region 13. The problem is the same for transistor configurations other than FinFET devices as well, e.g., planar FET devices. What is needed is a method for forming the CB gate contact 33 above the active region of the device so as to conserve valuable plot space on an integrated circuit product.

The present disclosure is directed to various methods of forming a gate contact above an active region of a semiconductor device and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate contact above an active region of a semiconductor device and the resulting device wherein the gate contact is positioned above the active region. An illustrative method of forming a gate contact for a gate structure of a transistor device formed above an active region of a semiconducting substrate surrounded by an isolation region is provided. The transistor device includes a source/drain region. A gate length direction is defined along an axial length of the gate structure and a gate width direction is defined in a direction perpendicular to the gate length direction and extending between the gate structure and the source/drain region. The method includes forming an initial conductive source/drain structure that is conductively coupled to the source/drain region of the transistor device. A recess etching process is performed on the initial conductive source/drain structure to thereby define a stepped conductive source/drain structure with a cavity defined therein. The stepped conductive source/drain contact structure has a stepped configuration when viewed in cross-sectional view taken through the stepped conductive source/drain contact structure in a direction corresponding to the gate width direction. A non-conductive structure is formed in the cavity defined in the stepped conductive source/drain structure. A layer of insulating material is formed above the gate structure, the stepped conductive source/drain structure, and the non-conductive structure. A gate contact opening is formed in the layer of insulating material. A conductive gate contact is formed in the gate contact opening that is conductively coupled to the gate structure.

Another illustrative method of forming a gate contact for a gate structure of a transistor device formed above an active region of a semiconducting substrate surrounded by an isolation region is provided. The transistor device includes a source/drain region. A gate length direction is defined along an axial length of the gate structure and a gate width direction is defined in a direction perpendicular to the gate length direction and extending between the gate structure and the source/drain region. The method includes forming an initial conductive source/drain structure that is conductively coupled to the source/drain region of the transistor device. A recess etching process is performed on the initial conductive source/drain structure to thereby define a stepped conductive source/drain structure. The stepped conductive source/drain structure has a recessed portion and a non-recessed portion. A thickness of the recessed portion is less than a thickness of the non-recessed portion. The stepped conductive source/drain contact structure has a stepped configuration when viewed in cross-sectional view taken through the stepped conductive source/drain contact structure in a direction corresponding to the gate width direction. A non-conductive structure is formed above the recessed portion of the stepped conductive source/drain structure. A layer of insulating material is formed above the gate structure, the stepped conductive source/drain structure and the non-conductive structure. A gate contact opening is formed in the layer of insulating material. A conductive gate contact is formed in the gate contact opening that is conductively coupled to the gate structure.

Yet another illustrative method of forming a gate contact for a gate structure of a transistor device formed above an active region of a semiconducting substrate surrounded by an isolation region is provided. The transistor device includes a source/drain region. A gate length direction is defined along an axial length of the gate structure and a gate width direction is defined in a direction perpendicular to the gate length direction and extending between the gate structure and the source/drain region. The method includes forming an initial conductive source/drain structure that is conductively coupled to the source/drain region of the transistor device. The initial conductive source/drain structure has an initial axial length in the gate width direction of the transistor device. A recess etching process is performed on the initial conductive source/drain structure to thereby define a stepped conductive source/drain structure with a cavity defined therein. The cavity has an axial length that is approximately 5-80% of the initial axial length of the initial conductive source/drain structure. The stepped conductive source/drain contact structure has a stepped configuration when viewed in cross-sectional view taken through the stepped conductive source/drain contact structure in a direction corresponding to the gate width direction. A non-conductive structure is formed in the cavity defined in the stepped conductive source/drain structure. A layer of insulating material is formed above the gate structure, the stepped conductive source/drain structure and the non-conductive structure. A gate contact opening is formed in the layer of insulating material so as to expose a portion of the non-conductive structure. A conductive gate contact is formed in the gate contact opening that is conductively coupled to the gate structure.

BRIEF DESCRIPTION OF THE DRAWINGS

The disclosure may be understood by reference to the following description taken in conjunction with the accompanying drawings, in which like reference numerals identify like elements, and in which.

Figure 1A:
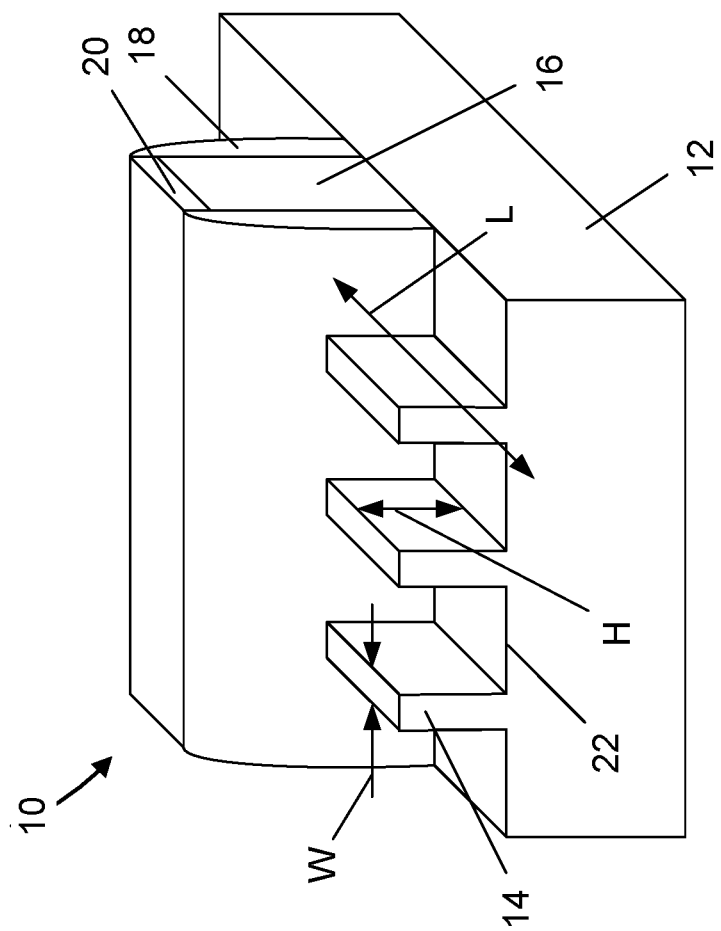
FIG. 1A is a simplistic depiction of an illustrative prior art FinFET device.
Figure 1B:
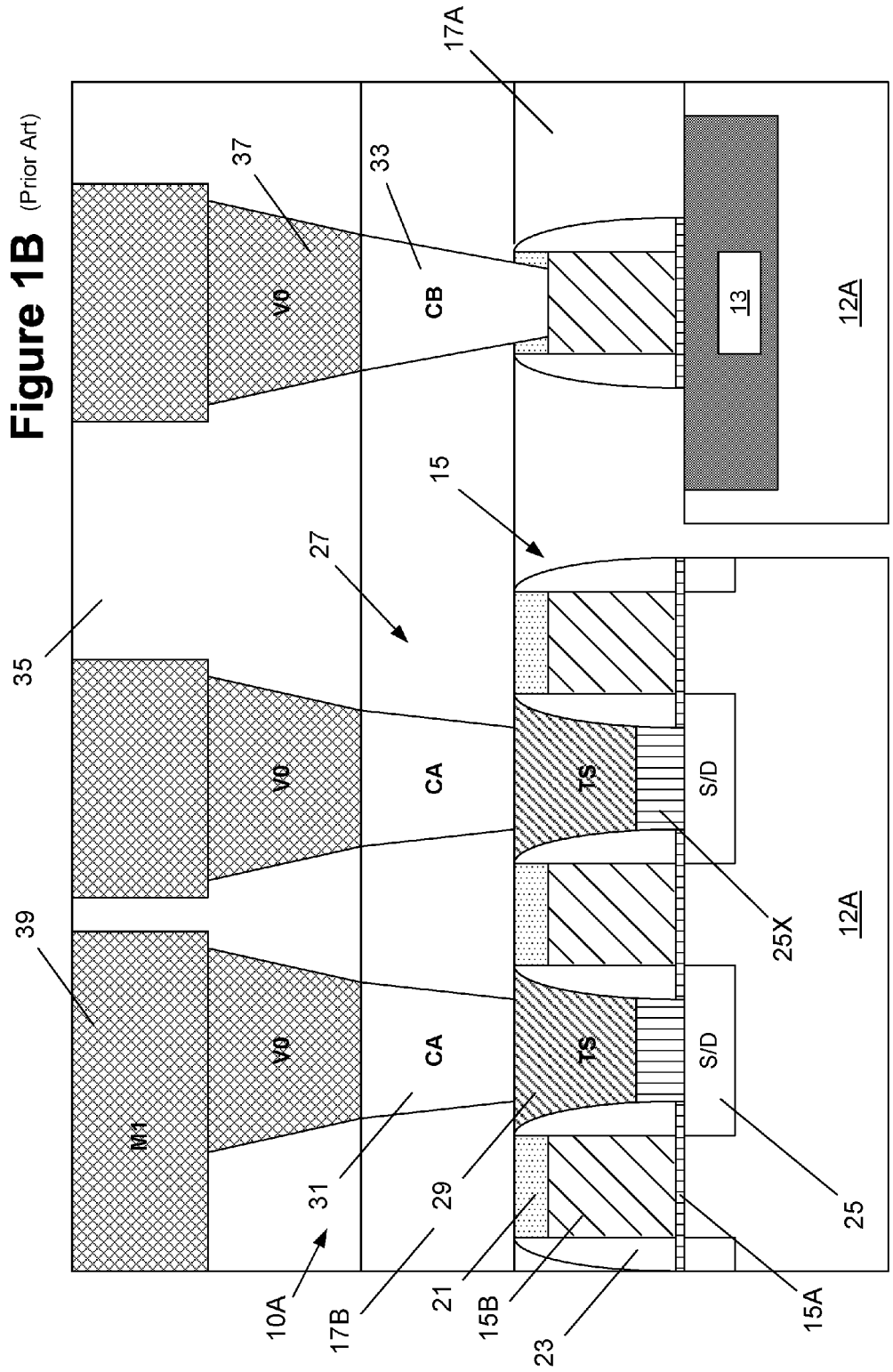
FIGS. 1B-1C depict various illustrative prior art arrangements of device-level contacts and metallization layers for an integrated circuit product.
Figure 1C:
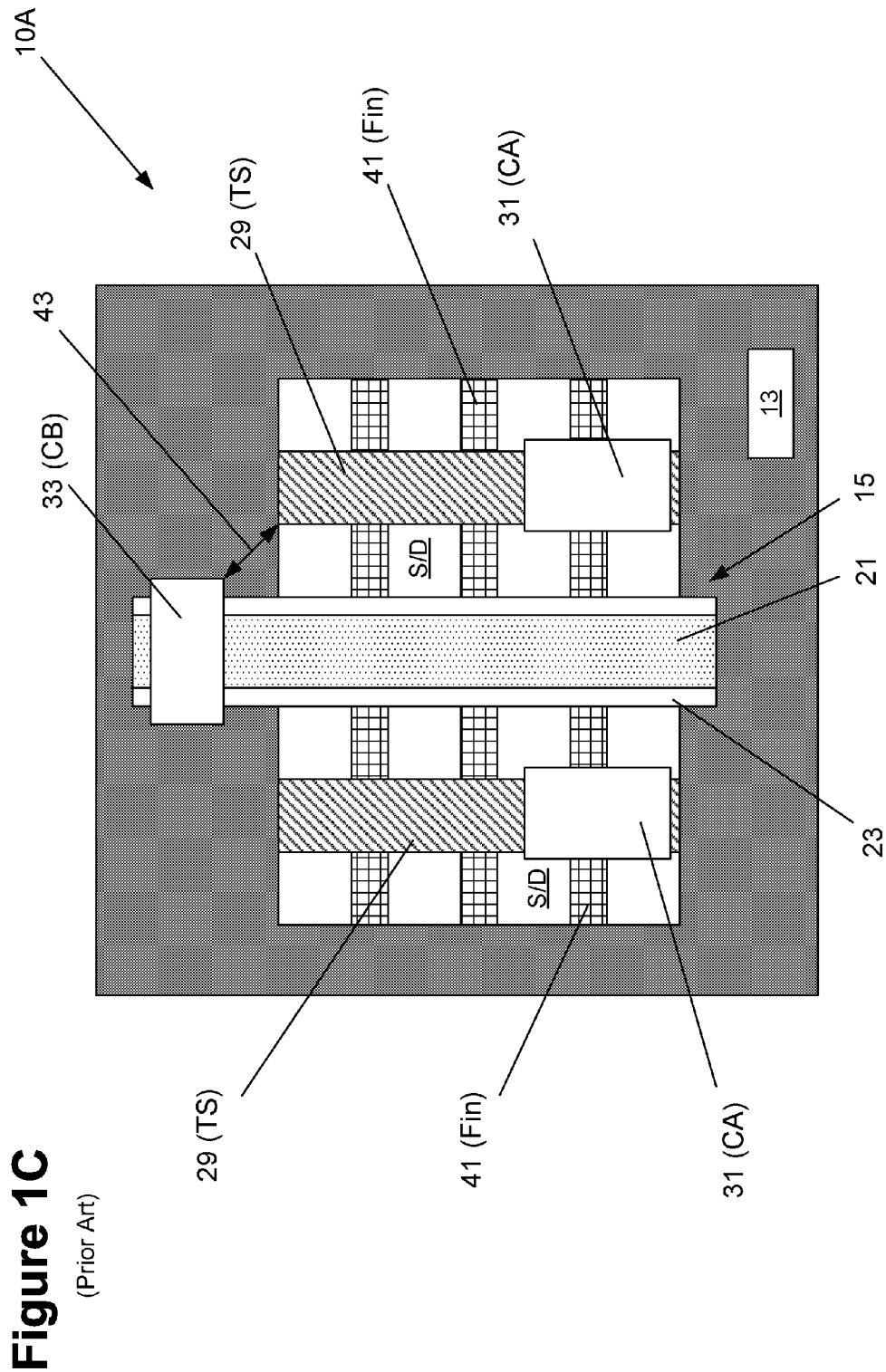

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a gate contact above an active region of a semiconductor device and the resulting device, wherein the gate contact is positioned above the active region. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD)

process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2X depict various illustrative methods disclosed herein for forming a gate contact above an active region of a semiconductor device. Each of the figures contains a simplistic plan view showing where various cross-sectional views are taken in the drawings. The plan view also depicts where illustrative source/drain contacts ("CA") and a gate contact ("CB") will eventually be formed for the product 100. As indicated in FIG. 2A, the view X-X is a cross-sectional view taken through the device (in a direction corresponding to the gate length direction of the device) at a location where the gate contact ("CB") will eventually be formed. It should also be noted that, although each figure contains a plan view of the device, not all aspects of the processing shown in the cross-sectional views will be depicted in the plan view so as to not overly complicate the drawings.

With continuing reference to FIG. 2A, the illustrative product 100 will be formed in and above the semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

As noted above, the subject matter disclosed herein may be employed where the gate structures for the illustrative transistor devices may be formed using well-known "gate first" or "replacement gate" manufacturing techniques. In the example depicted herein, the novel methods and devices will be described in the context of using a replacement gate manufacturing technique to form the gate structure for the product 100. Accordingly, FIG. 2A depicts the product 100 at a point in fabrication wherein several process operations have been performed. First, an isolation region 103 was formed in the substrate 102 so as to define an active region (102X) where a transistor device will be formed. Next, a plurality of illustrative gate structures 104 were formed above the substrate 102. Each of the gate structures 104 includes a schematically depicted sacrificial gate structure 106, a sidewall spacer 108 and a gate cap layer 110. The gate structure 104X is the active gate structure for the transistor device, while the gate structures 104Y1 and 104Y2 are "dummy" gate structures as it relates to the operation of the transistor device. The sacrificial gate structure 106 typically includes a sacrificial gate insulation layer (not separately shown), such as silicon dioxide, and a dummy or sacrificial gate electrode (not separately shown), such as polysilicon or amorphous silicon. The sidewall spacer 108 and the gate cap layer 110 are typically comprised of silicon nitride. The gate structures 104 may be formed using well-known processing techniques. After the gate structures 104 were formed, an epi semiconductor material 114 was formed in the source/drain regions 113 of the transistor devices. The epi semiconductor material 114 need not be formed in all applications. The physical size of the gate structures 104 and the gate pitch for the gate structures may vary depending upon the particular application.

Figure 2B:
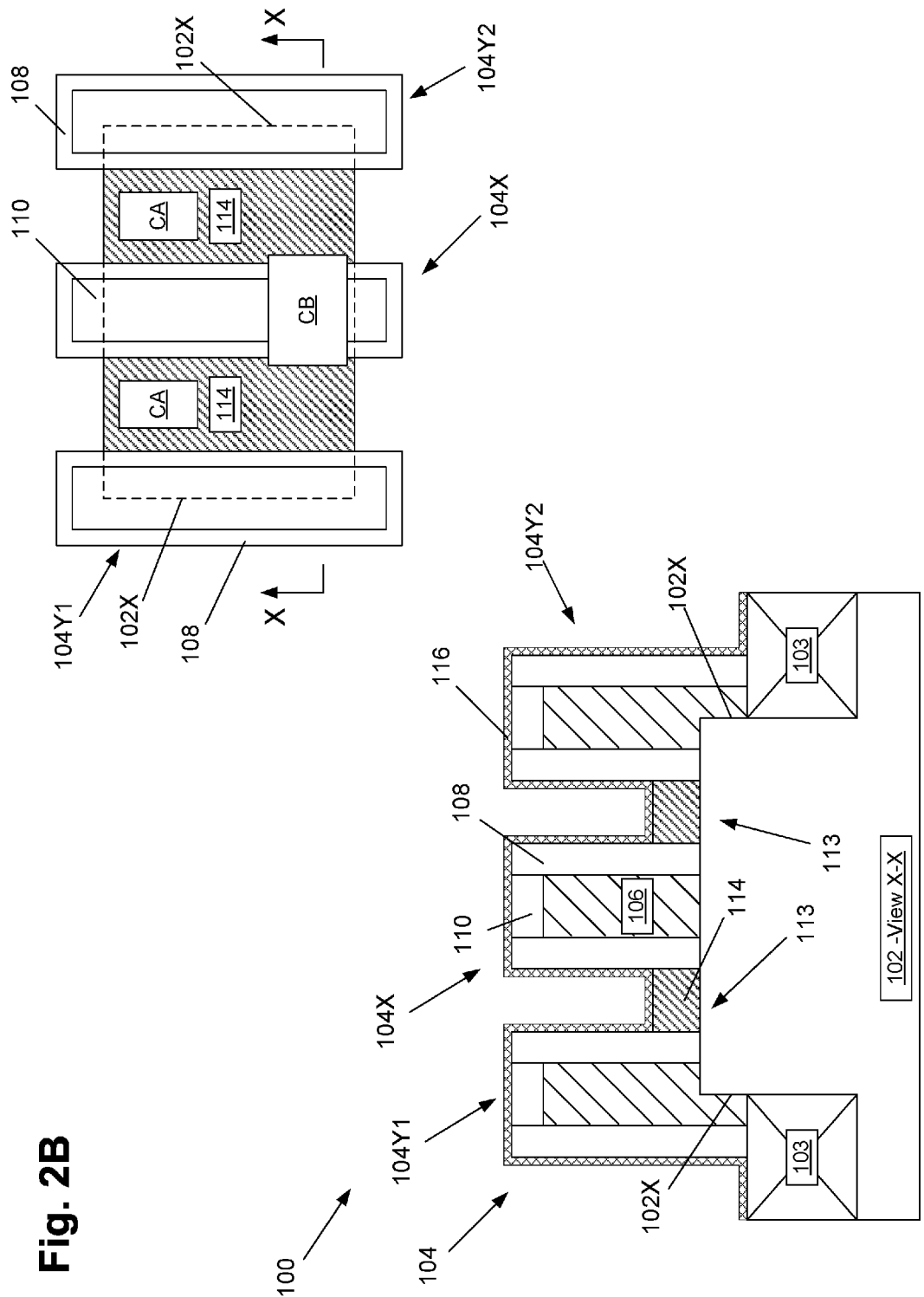
FIGS. 2A-2X depict various methods disclosed herein for forming a gate contact above an active region of a semiconductor device.

FIG. 2B depicts the product 100 after a etch stop layer 116 was formed on the product 100 by performing a conformal deposition process. The etch stop layer 116 may be comprised of a variety of materials, e.g., silicon dioxide, etc., and it may be formed by performing a conformal ALD or CVD process. The thickness of the etch stop layer 116 may vary depending upon the particular application, e.g., 3-6 nm.

Figure 2C:
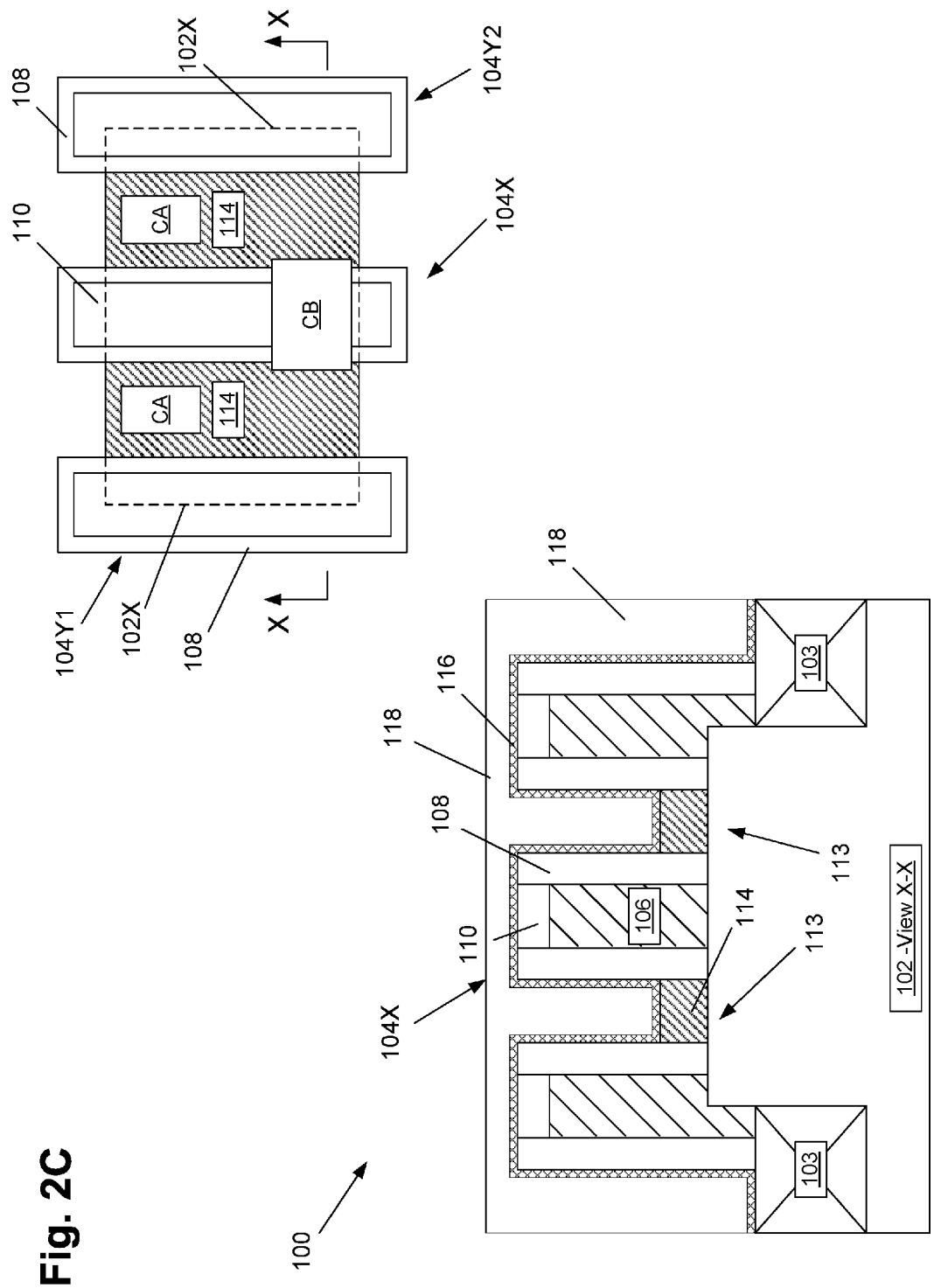

FIG. 2C depicts the product 100 after a layer of material 118 was formed on the product 100 by performing a conformal deposition process. The layer of material 118 may be comprised of a variety of materials, e.g., silicon nitride, etc., and it may be formed by performing a conformal ALD or CVD process. The thickness of the layer of material 118 may vary depending upon the particular application, e.g., 20-30 nm. Given the pitch between the gate structures 104, the layer of material 118 will typically "pinch-off" in the space between adjacent gate structures 104 above the source/drain regions 113 so as to substantially fill the space between adjacent gate structures 104. Of course, some voids may be present in the material 118 positioned between adjacent gate structures 104.

Figure 2D:
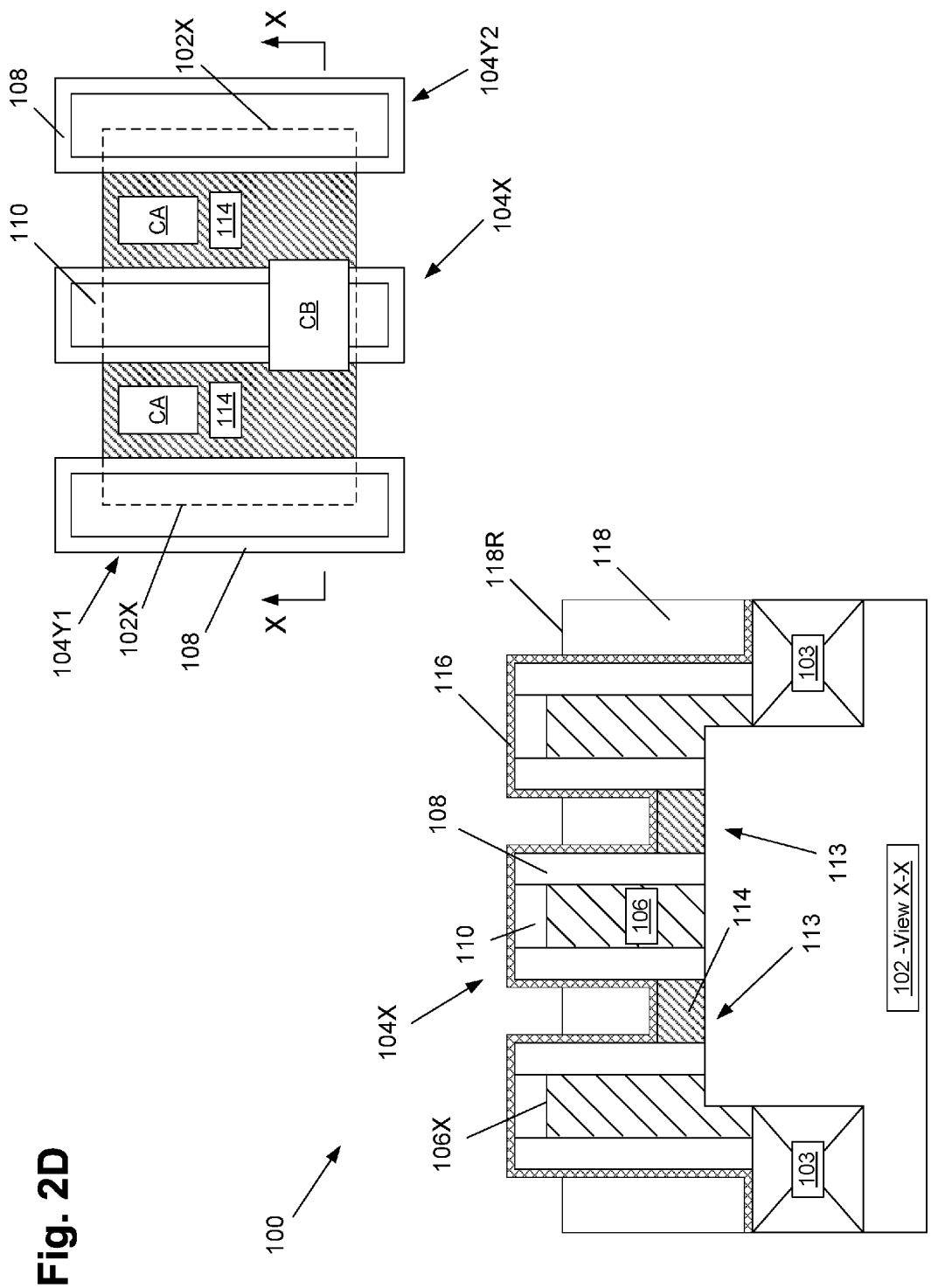

FIG. 2D depicts the product 100 after a timed, recess etching process was performed on the layer of material 118. After the etching process, the recessed layer of insulating material 118 has a recessed upper surface 118R that is positioned at a level that is below a level of an upper surface 106X of the sacrificial gate structure 106, e.g., by a distance of about 2-10 nm. Also note that this insulating material 118—the ILD material—may be made of silicon nitride, which is different from prior art structures wherein the ILD material positioned above the source/drain regions (and fills substantially all of the space between the sidewall spacers on adjacent gate structures) is typically made of silicon dioxide.

Figure 2E:
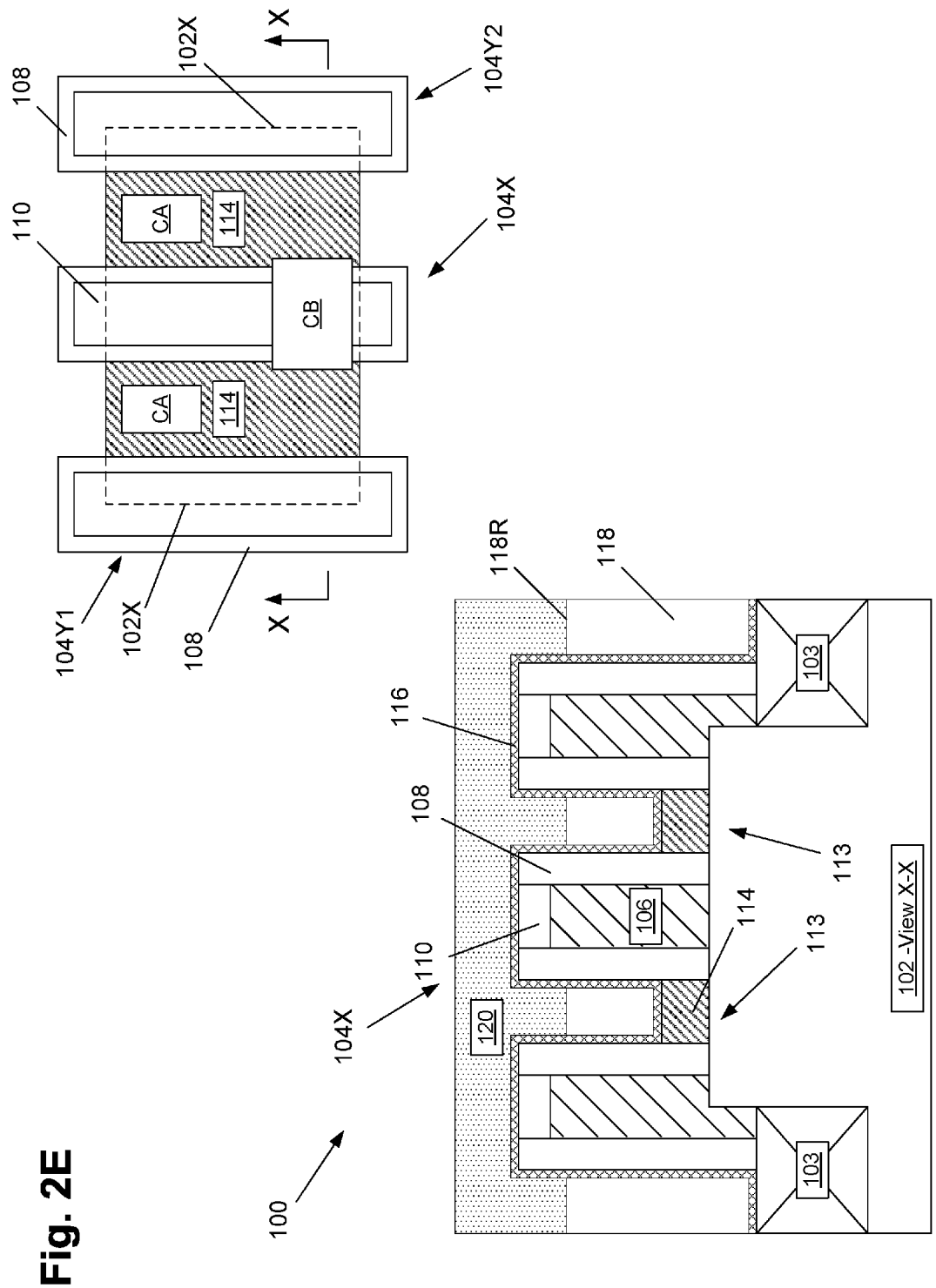

FIG. 2E depicts the product 100 after an illustrative layer of insulating material 120, e.g., silicon dioxide, was blanket deposited above the product 100.

Figure 2F:
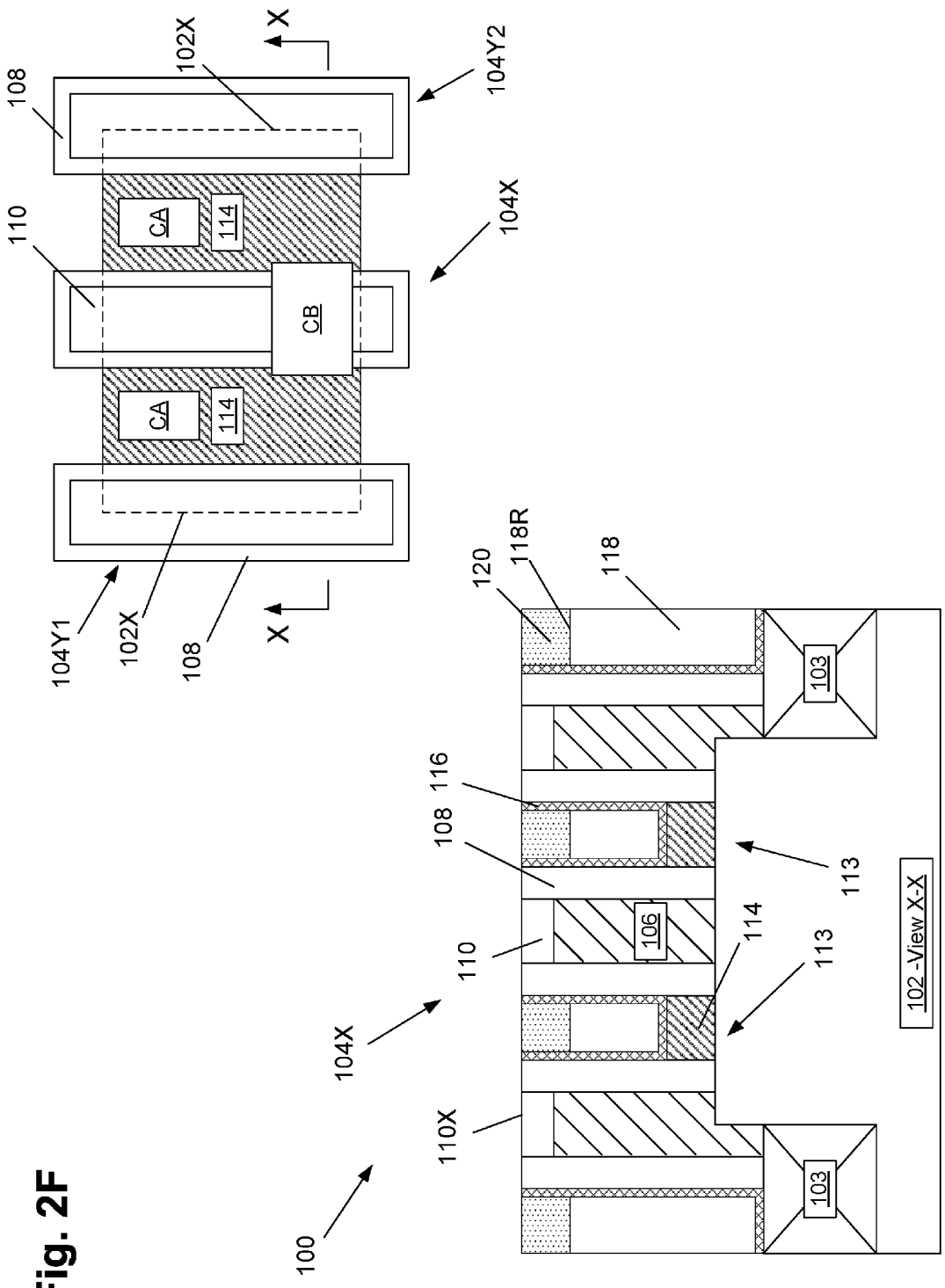

FIG. 2F depicts the product 100 after one or more planarization processes (e.g., CMP) were performed to remove a portion of the layer of insulating material 120 and a portion of the etch stop layer 116. At the completion of the planarization process, the upper surfaces 110X of the gate cap layers 110 are exposed.

FIG. 2G depicts the product 100 after one or more planarization processes (e.g., CMP) were performed to remove the gate cap layers 110 and portions of the sidewall spacers 108 so as to thereby expose the upper surface 106X of the sacrificial gate structure 106 for further processing, i.e., so that the sacrificial gate structures 106 can be removed.

FIG. 2H depicts the product 100 after one or more wet or dry etching processes were performed to remove the sacrificial gate structures 106 (gate insulation layer plus gate electrode) to thereby define a plurality of gate cavities 122 where replacement gate structures will subsequently be formed for the product 100. Typically, the sacrificial gate insulation layer (not separately shown) is removed as part of the replacement gate technique. Even in cases where the sacrificial gate insulation layer is intentionally removed, there may typically be a very thin native oxide layer (not shown) that forms on the surface of the substrate within the gate cavities 122.

Figure 2I:
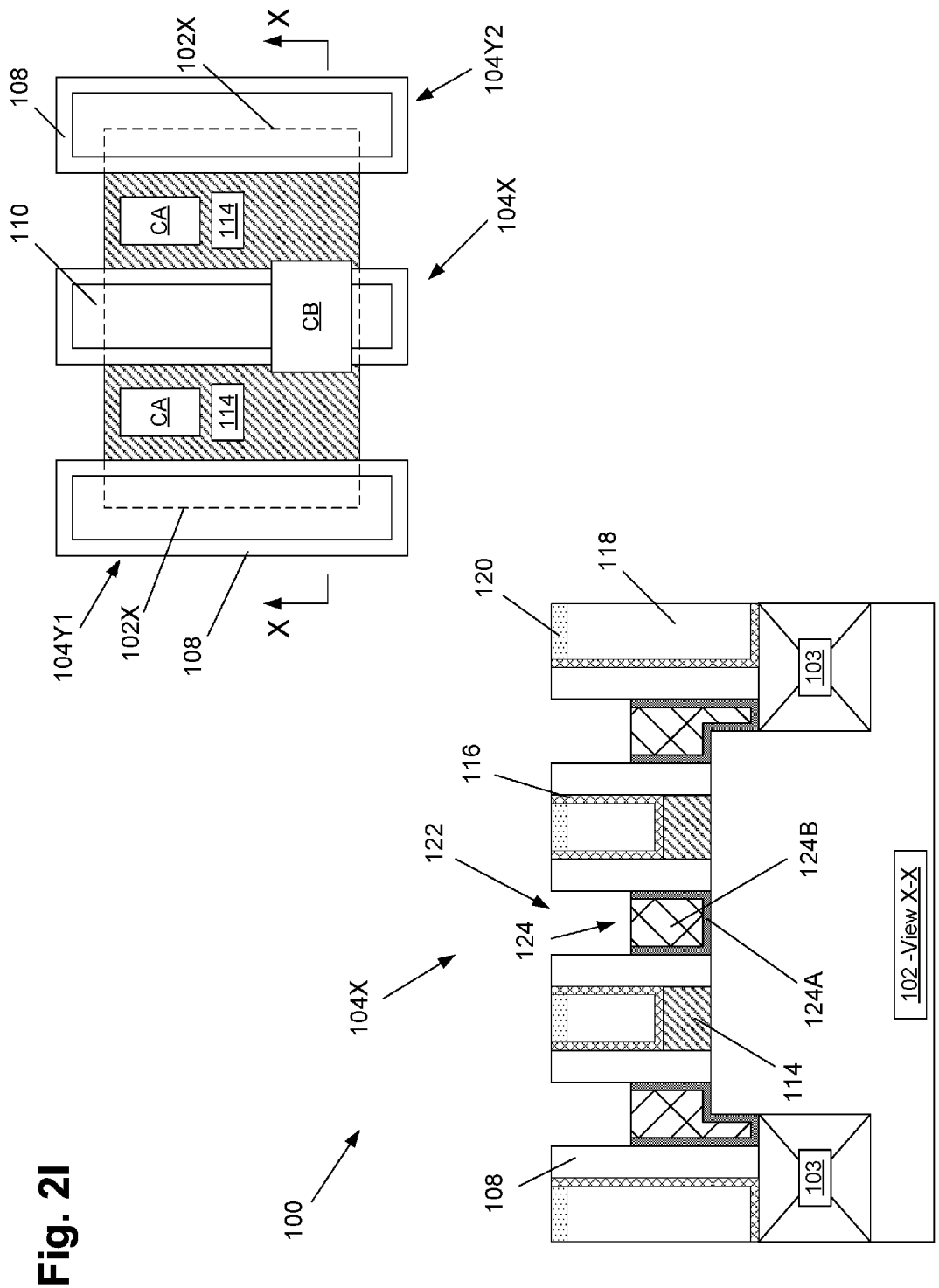

The next major process sequence involves formation of the replacement gate structures 124 for the product 100. The replacement gate structures 124 that will be depicted herein are intended to be representative in nature of any type of gate structure that may be employed in manufacturing integrated circuit products using so-called gate-last (replacement gate) manufacturing techniques. Of course, as noted above, the presently disclosed inventions may be employed in situations where the gate structures for the transistor devices are formed using well-known gate-first manufacturing techniques. In the context of an illustrative replacement gate process, with reference to FIG. 2I, a pre-clean process was performed in an attempt to remove all foreign materials from within the gate cavities 122 prior to forming the various layers of material that will become part of the replacement gate structures 124. Next, a high-k (k value greater than 10) gate insulation layer 124A, such as hafnium oxide (or other high-k materials), was deposited across the substrate 102 and within the gate cavities 122 by performing a conformal deposition process.

Thereafter, multiple conductive layers that will collectively constitute the gate electrode 124B, such as metal layers, were sequentially deposited above the substrate 102 and within the gate cavities 122 such that the gate cavities 122 were substantially overfilled with material. Then, one or more CMP processes were performed to remove excess materials positioned outside of the gate cavities 122. Next, one or more recess etching processes were performed to recess the materials within the gate cavities 122 so as to thereby make room for a gate cap layer. These process operations result in the definition of the illustrative and simplistically depicted replacement gate structures 124 depicted in FIG. 2I.

Figure 2J:
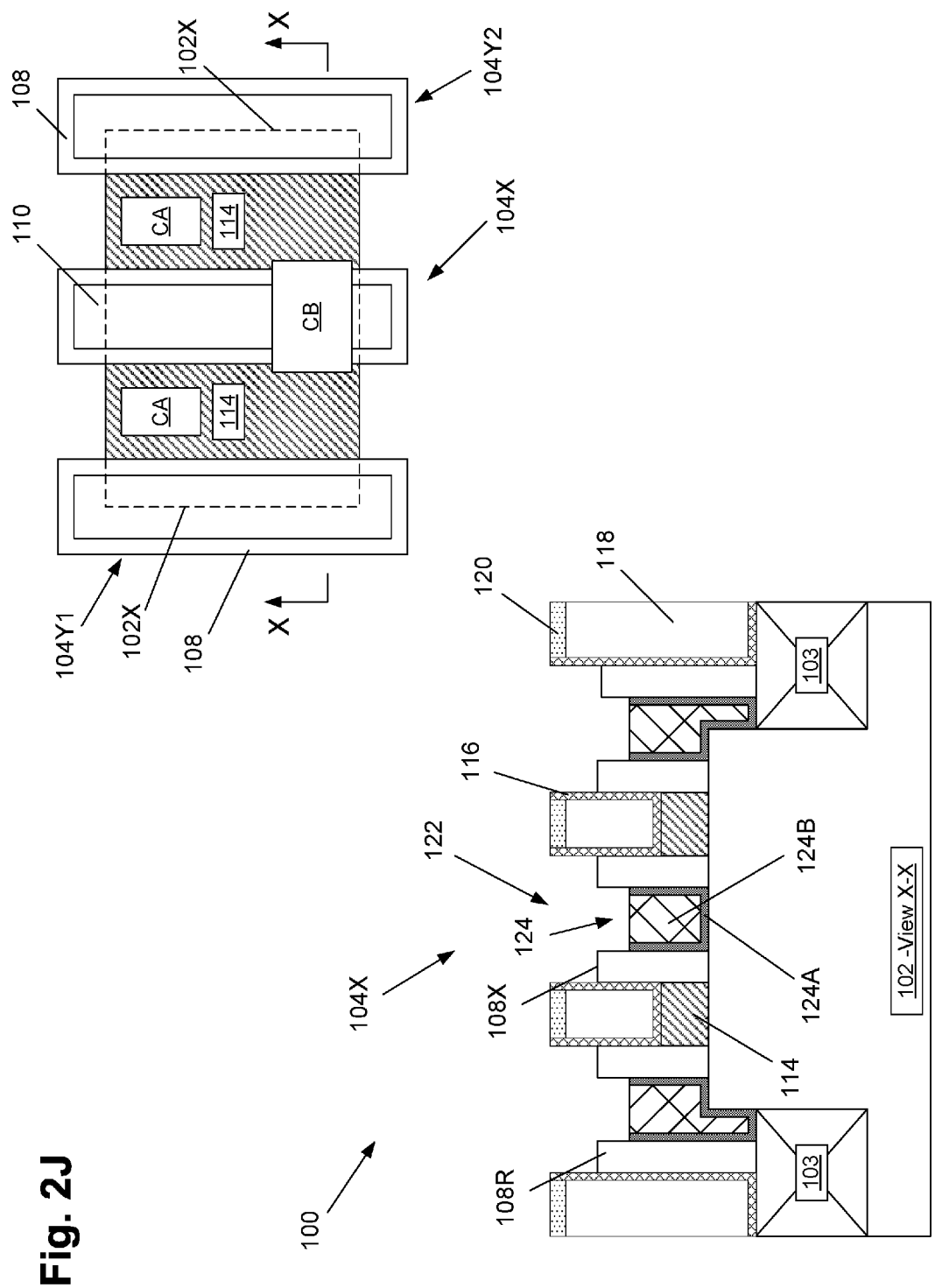

FIG. 2J depicts the product 100 after a recess etching process was performed to selectively remove a portion of the vertical height of the spacers 108 and thereby define a plurality of recessed spacers 108R having a recessed upper surface 108X. The amount or degree of recessing of the spacers 108 may vary depending upon the particular application.

Figure 2K:
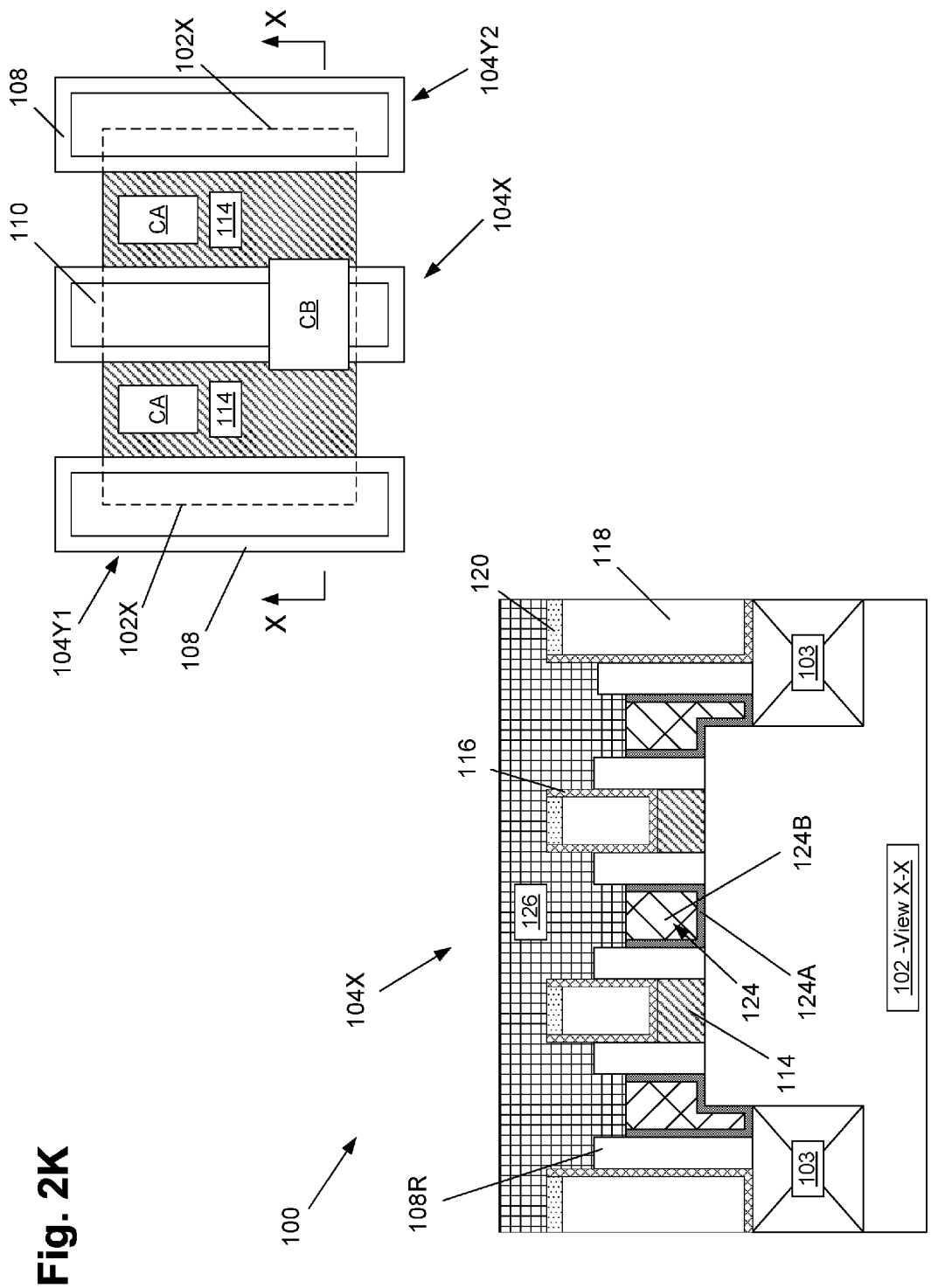

FIG. 2K depicts the product 100 after a layer of insulating material 126 (e.g., silicon dioxide) was formed above the product 100 using traditional deposition techniques. The layer of insulating material 126 over-fills the recess above the replacement gate structures 124 within the gate cavities 122.

FIG. 2L depicts the product 100 after one or more planarization processes (e.g., CMP) were performed on the layer of insulating material 126 such that the upper surface of the layer of insulating material 126 is substantially even with the upper surface of the layer of material 118 (e.g., silicon nitride). This process operation results in a plurality of T-shaped gate cap layers 126A positioned above the replacement gate structures 124 and above the recessed upper surfaces 108X of the recessed spacers 108R. Importantly, unlike traditional manufacturing techniques, in this embodiment, the method disclosed herein involves the formation of T-shaped gate cap layers 126A made of silicon dioxide as compared to traditional rectangular-shaped gate cap layers that are typically made of silicon nitride and positioned between silicon nitride spacers. Also note that the upper surface 118S of the insulating material 118 positioned above the raised epi source/drain regions 114 is at a level that is above the level of the recessed upper surface 108X of the recessed spacers 108R. The magnitude of this difference in height level between these structures may vary depending upon the particular application.

Figure 2M:
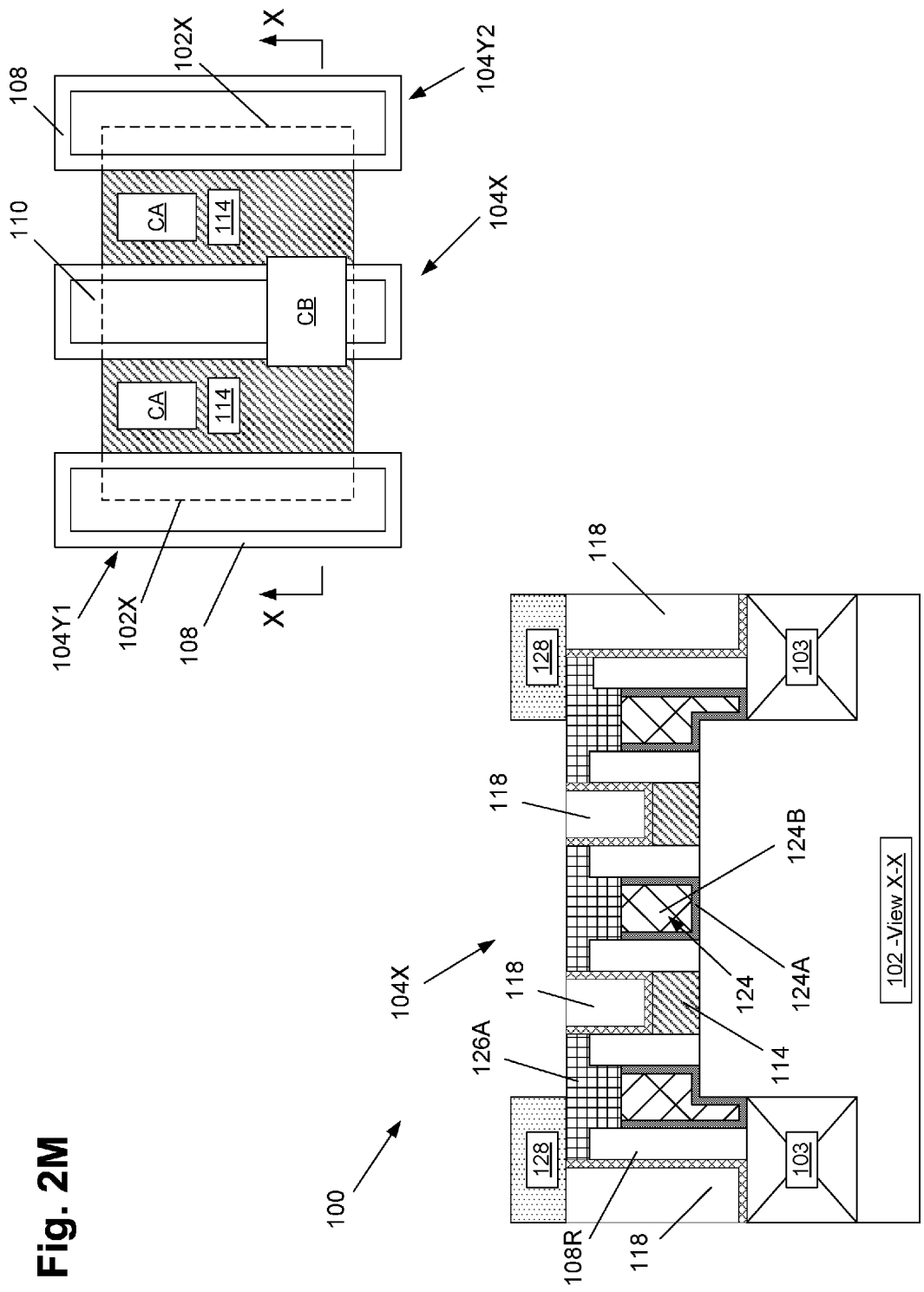

The next major process operation involves formation of conductive source/drain structures, e.g., trench silicide containing regions that will contact the raised epi source/drain regions 114 and constitute the conductive structure between the raised epi source/drain regions 114 and the CA contact structures that are to be subsequently formed. Accordingly, FIG. 2M depicts the product 100 after a masking layer 128, e.g., OPL, was formed above the product 100 so as to expose the area above the source/drain regions 113 and at least the middle gate structure 104X.

Figure 2N:
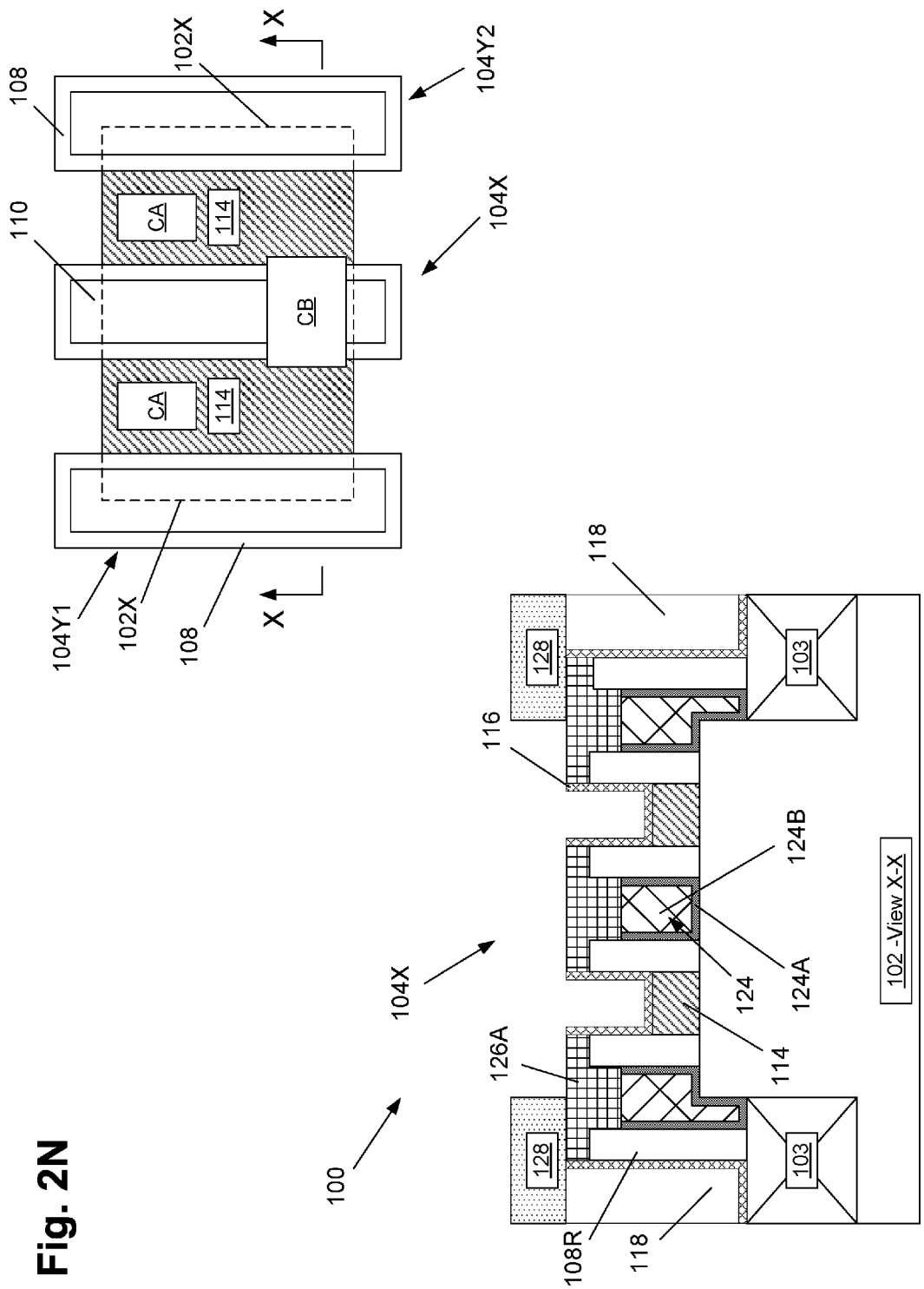

FIG. 2N depicts the product 100 after an etching process was performed to remove the exposed portions of the silicon nitride material 118—the ILD material—selectively relative to the silicon dioxide T-shaped gate cap layers 126A and the silicon dioxide etch stop layer 116. Note that, using the novel process flows disclosed herein, the ILD silicon nitride material 118 is removed selectively to surrounding silicon dioxide materials (126A, 116), which is a much easier process operation as compared to trying to selectively remove silicon dioxide materials relative to surrounding silicon nitride materials, which is the typical prior art process at this point in the process flow. Also note that the silicon dioxide T-shaped gate cap layer 126A and the silicon dioxide etch stop layer 116 protects the underlying silicon nitride recessed spacers 108R during the removal of the silicon nitride ILD material 118. Thus, the novel methods disclosed herein provide an easier process flow relative to prior art process flows as it relates to the process of forming conductive source/drain structures.

Figure 2O:
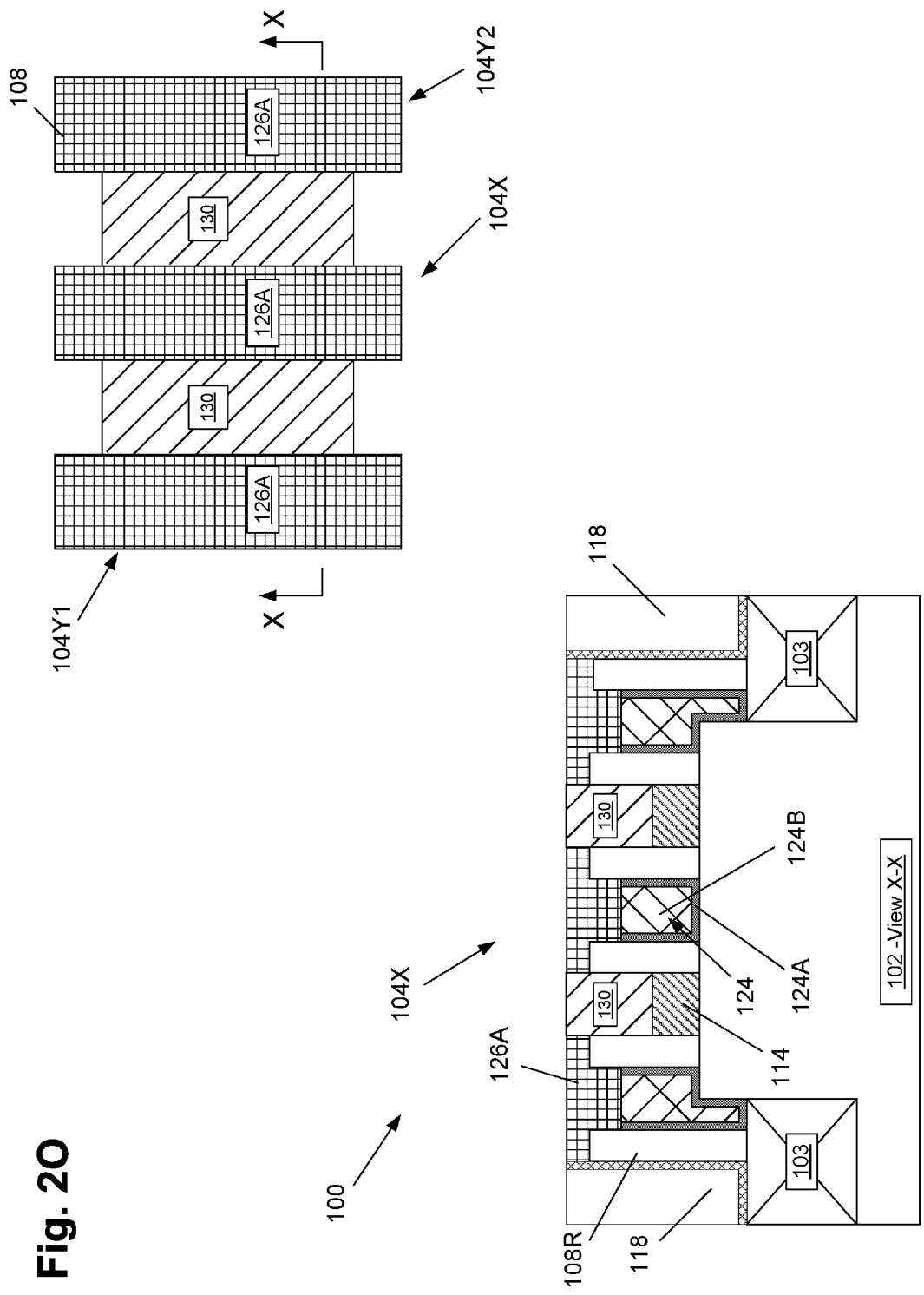

FIG. 2O depicts the product 100 after several process operations were performed. First, the masking layer 128 was removed. Then, a pre-clean process was performed prior to forming metal silicide regions that contact the raised epi material 114. This pre-clean process effectively removes the relatively thin silicon dioxide etch stop layer 116 while consuming very little of the silicon dioxide T-shaped gate cap layers 126A and exposes the upper surfaces of the raised epi material 114. Next, simplistically depicted conductive source/drain structures 130 were formed so as to establish contact to the raised epi source/drain regions 114. As noted above, the conductive source/drain structures 130 (irrespective of their precise configuration and the manner in which they are made) provide an electrical path between the raised epi source/drain regions 114 (or the source/drain region 113 if the epi material is not formed) and the CA contact structures that are to be subsequently formed for the product. The configuration and structure of the conductive source/drain structures 130 may vary depending upon the particular application. In one example, the conductive source/drain structures 130 are line-type structures that extend into and out of the drawing page in FIG. 2O view X-X that extend for substantially the entire length of the active region (in a direction that corresponds to the gate width direction of the device). In some cases, conductive source/drain structures 130 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the conductive source/drain structures 130, a chemical mechanical polishing (CMP) process is performed to remove excess materials above the upper surface of the gate cap layers 126A. The line-type conductive source/drain structures 130 are depicted in the plan view in FIG. 2O.

Figure 2P:
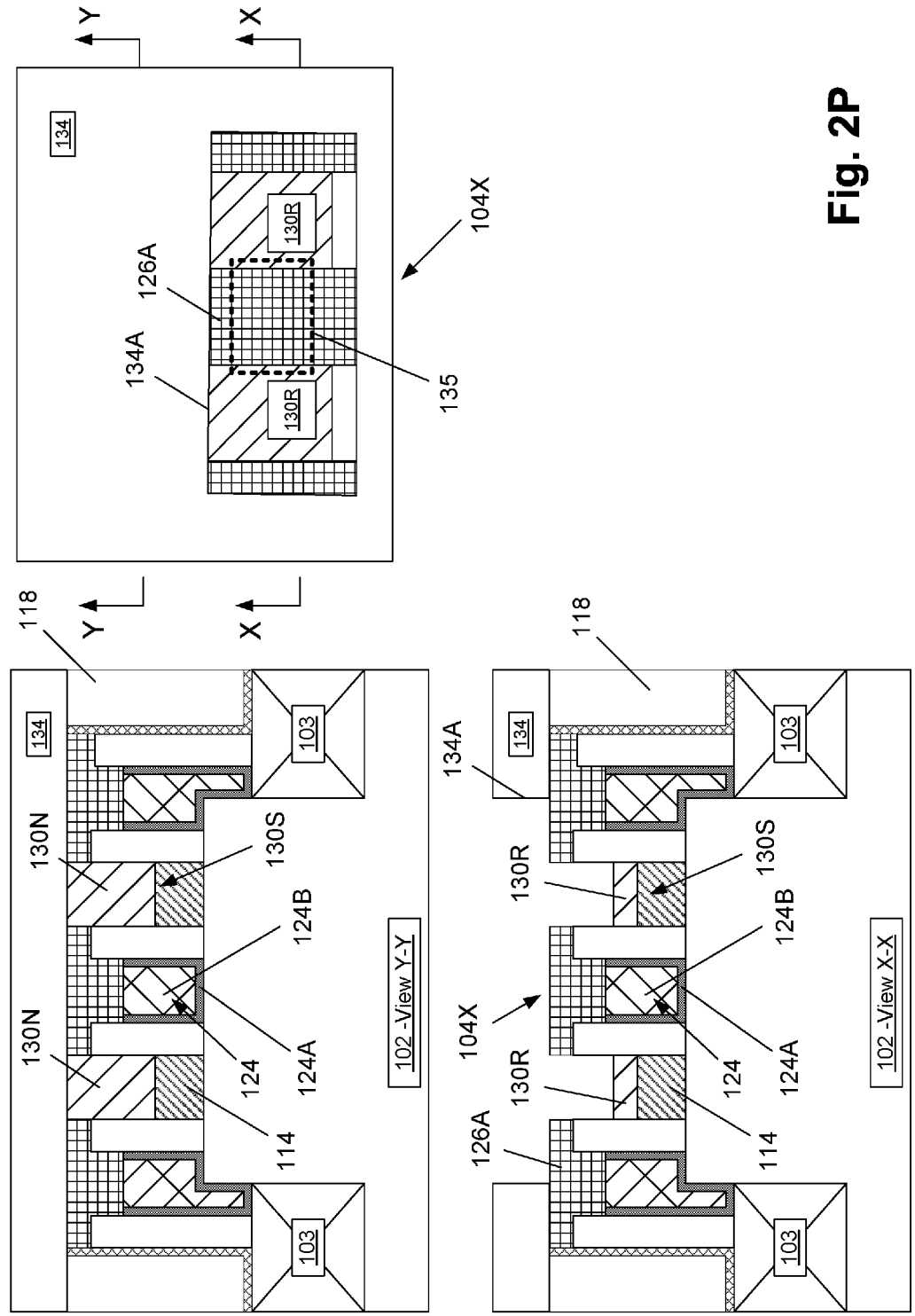

The next process operation will involve recessing a portion of the conductive source/drain structures 130 in an area adjacent where the gate contact (CB) will be formed. Accordingly, FIG. 2P depicts the product after a masking layer 134, e.g., OPL was formed above the product 100. FIG. 2P contains an additional cross-sectional view Y-Y taken through the device (in a direction corresponding to the gate length direction of the device) at a location where the source/drain contacts ("CA") will eventually be formed. The masking layer 134 has an opening 134A that exposes a portion of the conductive source/drain structures 130 in an area adjacent where the gate contact (CB) (as indicated by dashed line 135) will be formed to contact the gate structure 124. Thereafter, a recess etching process was performed through the masking layer 134 so as to recess the exposed portions of the conductive source/drain structures 130. This process operation results in formation of stepped conductive source/drain structures 130S having a recessed portion 130R (see view X-X) and a non-recessed portion 130N (see view Y-Y) that was protected by the masking layer 134 during the recess etching process.

Figure 2Q:
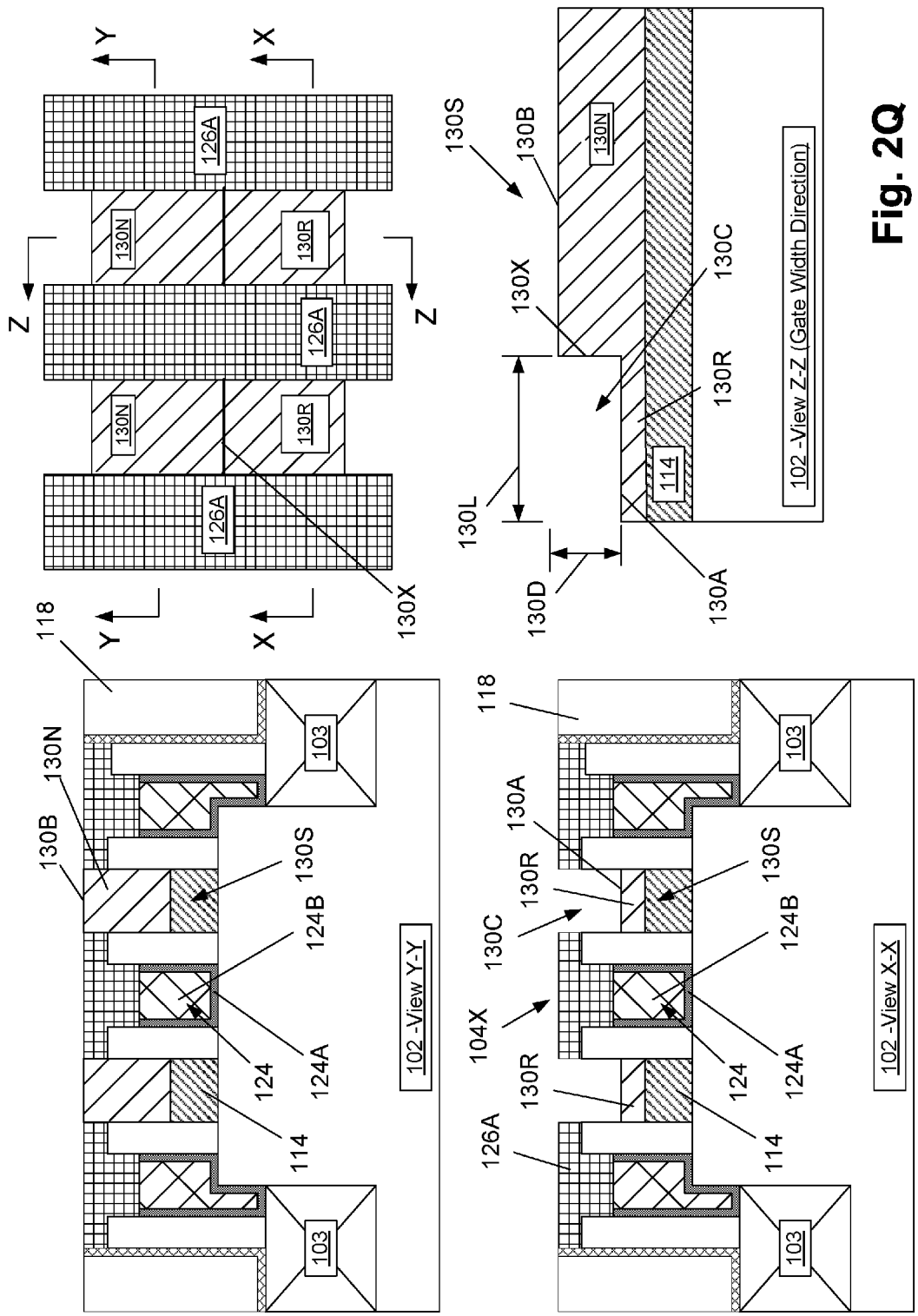

FIG. 2Q depicts the product 100 after the masking layer 134 was removed. FIG. 2Q contains an additional cross-sectional view Z-Z taken through the source/drain regions of the device (in a direction corresponding to the gate width direction of the device). As depicted therein, the stepped conductive source/drain structure 130S has a cavity 130C defined therein, wherein the depth 130D and axial length 130L (in the gate width direction) may vary depending upon the particular application. In one illustrative example, the depth 130D may be about 30-80% of the initial overall thickness of the original conductive source/drain structures 130, and the axial length 130L may be about 5-80% of the initial overall length of the original conductive source/drain structures 130 (or the stepped conductive source/drain structures 130S). In general, the axial length should be of sufficient length so as to provide an adequate process margin when forming the gate contact (CB) while considering potential misalignment (in the gate width direction) when forming the gate contact. Also note that, when viewed in a cross-sectional view along its axial length (view Z-Z), the recessed portion 130R of the stepped conductive source/drain structure 130S has an upper surface 130A, the non-recessed portion 130N of the stepped conductive source/drain structure 130S has an upper surface 130B and there is a stepped transition surface 130X between the upper surfaces 130A, 130B. Additionally, a vertical thickness of the recessed portion 130R is less than the vertical thickness of the non-recessed portion 130N, i.e., the recessed portion 130R may have a vertical thickness that is approximately 20-70% of the non-recessed portion 130N.

Figure 2R:
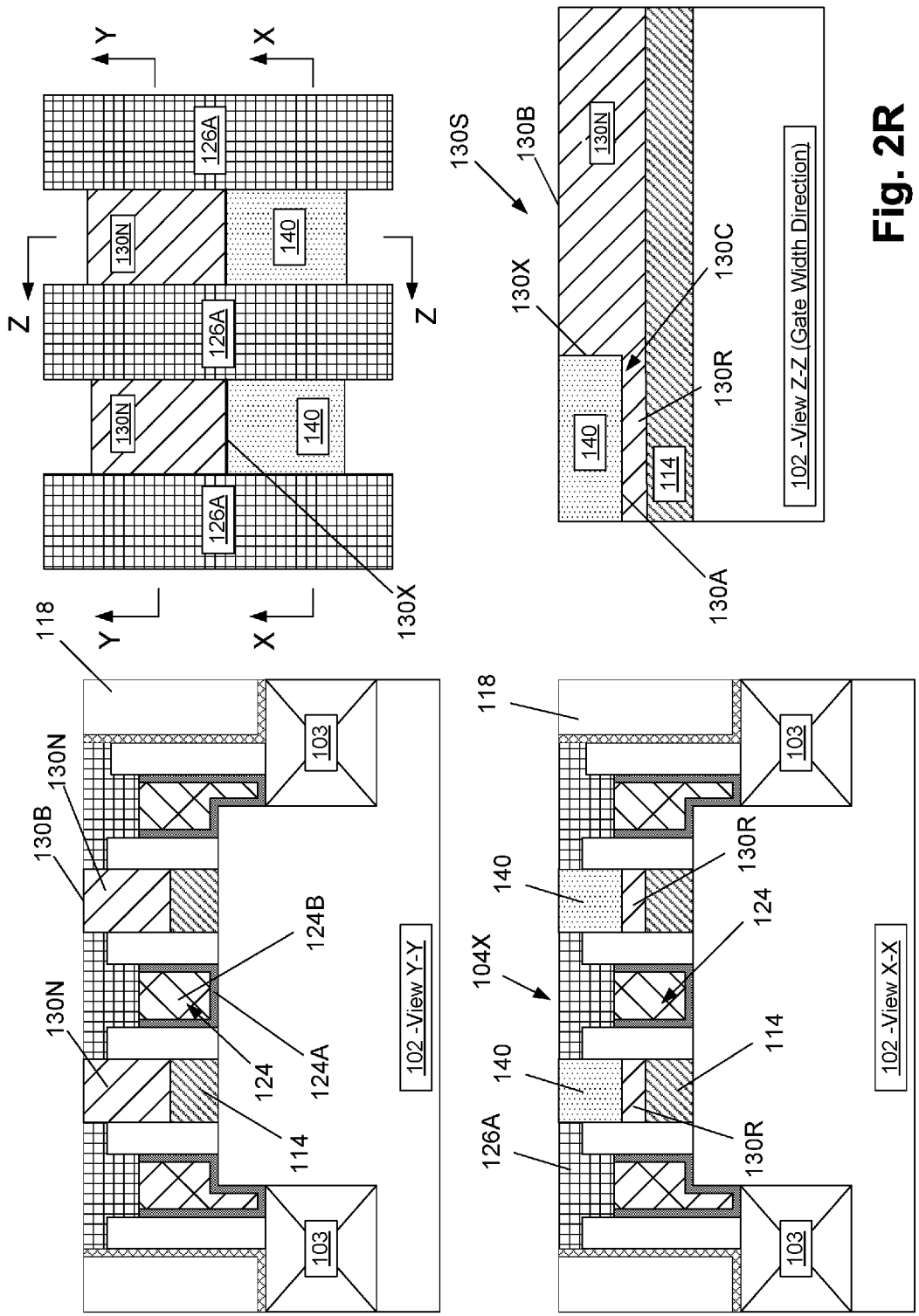

FIG. 2R depicts the product after non-conductive structures 140, e.g., silicon nitride, were formed in the cavities 130C of the stepped conductive source/drain structures 130S. The non-conductive structures 140 may be formed by depositing a layer of non-conductive material so as to overfill the cavities 130C and thereafter performing a CMP process operation to remove excess material.

Figure 2S:
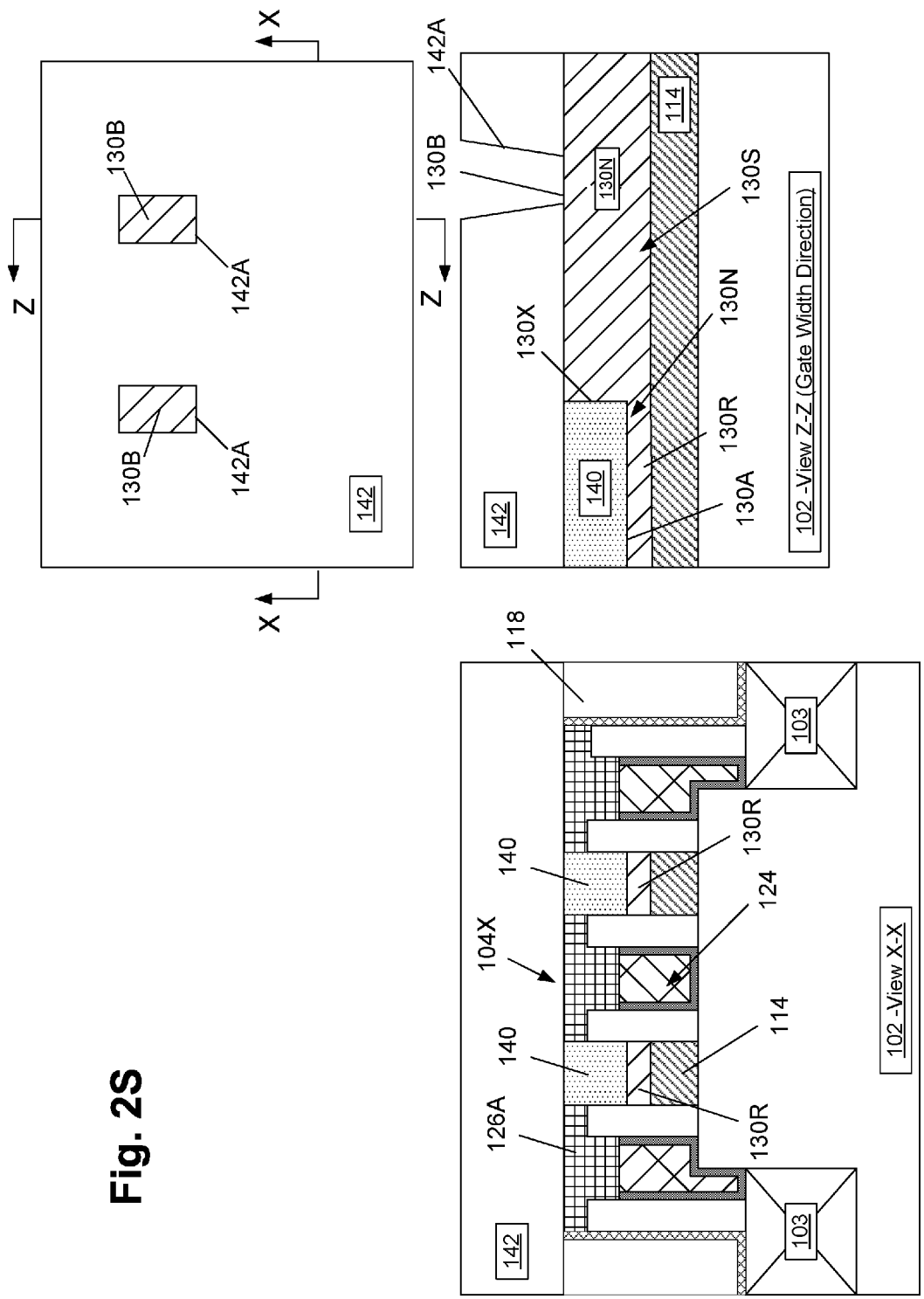

FIG. 2S depicts the product 100 after several process operations were performed. First, a layer of insulating material 142 (e.g., silicon dioxide) was formed above the product 100 using traditional deposition techniques. Thereafter, a patterned masking layer (not shown) was formed above the layer of insulating material 142 and an etching process was performed to define a plurality of CA contact openings 142A in the layer of insulating material 142 that expose the upper surface 130B of the non-recessed portion 130N of the stepped conductive source/drain structures 130S. Thereafter, the masking layer was removed.

Figure 2T:
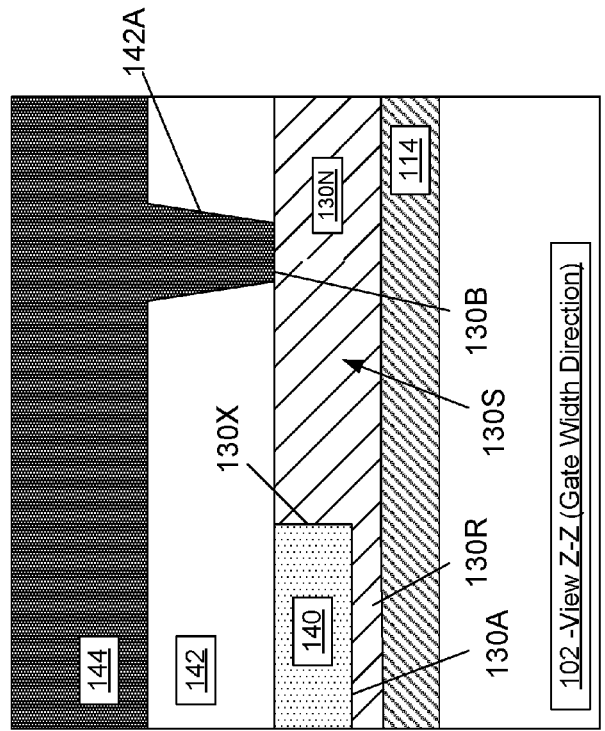
Figure 2T:
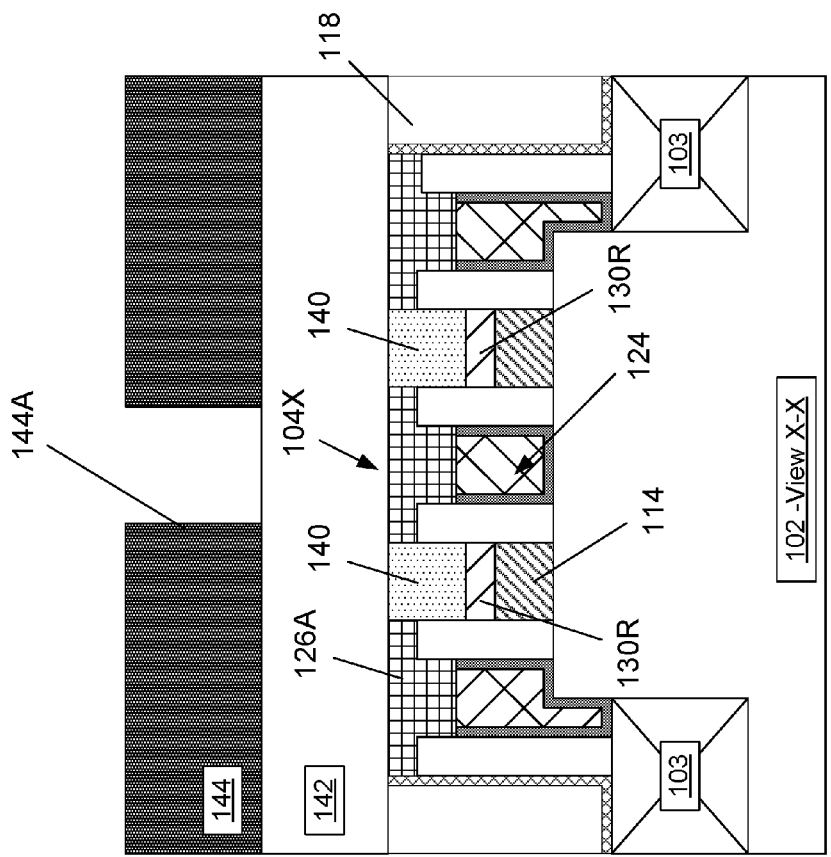

FIGS. 2T and 2U (plan view) depict the product after a masking layer 144, e.g., OPL, was formed above the product 100. The masking layer 144 covers the previously formed CA contact openings 142A. The masking layer 144 has an opening 144A that corresponds to a location for a gate contact (CB) opening 142B that will be formed in the layer of insulating material 142.

Figure 2V:
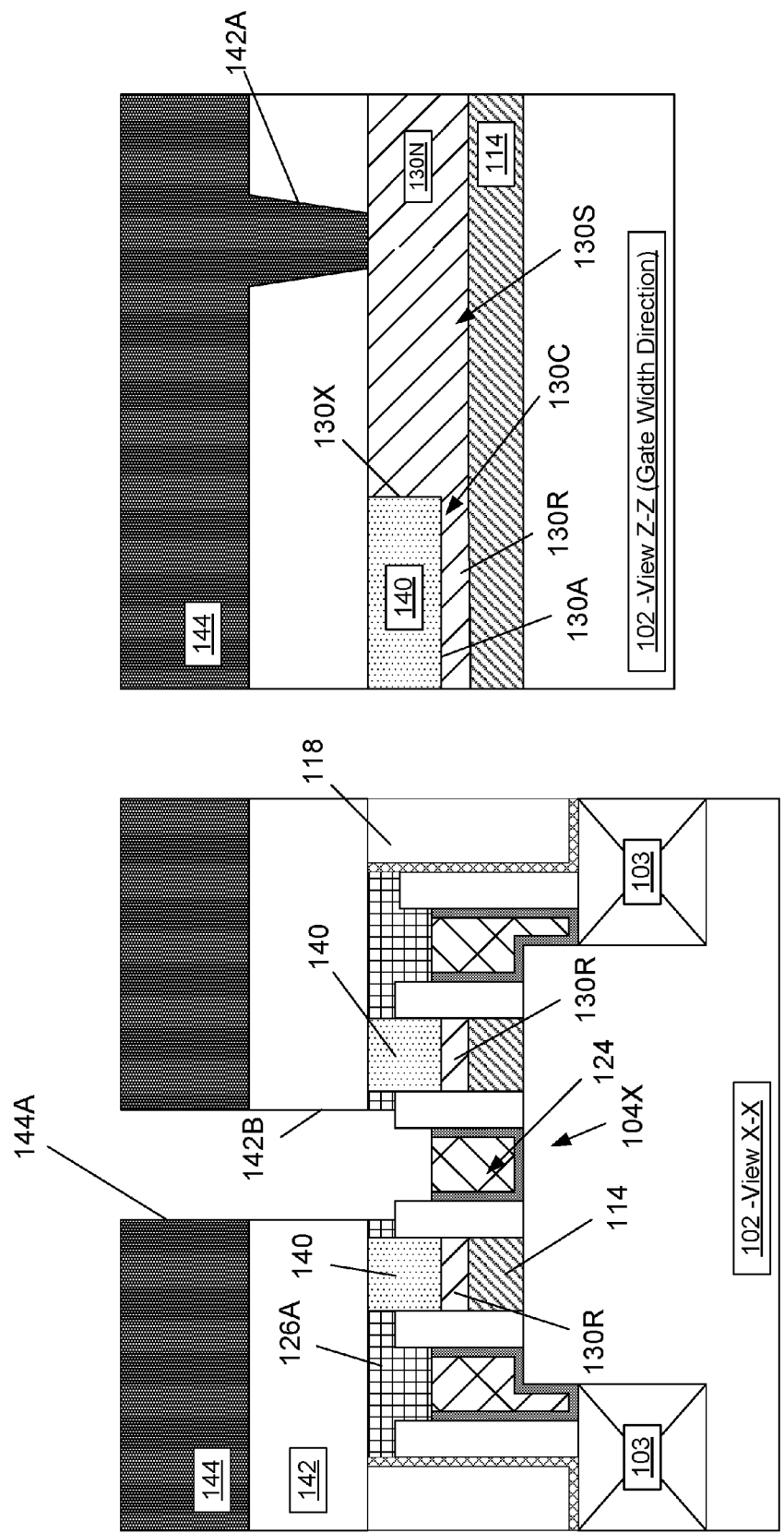

FIGS. 2V and 2W (plan view) depict the product 100 after one or more etching processes were performed through the masking layer 144 to define the gate contact (CB) opening 142B in the layer of insulating material 142 and to remove the portions of the silicon dioxide T-shaped gate cap layer 126A so as to thereby expose the gate structure 124. Note that, due to the formation of the non-conductive structures 140, contact, i.e., shorting, between a gate contact structure 150 (described below) formed in the gate contact (CB) opening 142B and the recessed portion 130R and the non-recessed portion 130N of the stepped conductive source/drain structures 130S is prevented, even in the case of significant misalignment of the gate contact opening 142B as reflected by the dashed line 1423 in FIG. 2W (a plan view). Also note that the formation of the opening that exposes the gate structure 124 so that contact can be made to the gate structure 124 only involves etching of silicon dioxide materials, e.g., the layer 142 and the silicon dioxide T-shaped gate cap layer 126A.

FIG. 2X depicts the product 100 after a gate contact (CB) structure 150 and a plurality of source/drain contact (CA) structures 152 were formed on the product using traditional manufacturing techniques. The contact structures 150, 152 may be of any desired cross-sectional configuration when viewed from above, e.g., square, rectangular, round, etc. The contact structures 150, 152 are intended to be schematic and representative in nature, as they may be formed using any of a variety of different conductive materials and by performing traditional manufacturing operations. The contact structures 150, 152 may also contain one or more barrier layers (not depicted). In one illustrative example, the contact structures 150, 152 may be formed by depositing a liner, e.g., Ti, TiN, followed by overfilling the contact openings with a conductive material, such as tungsten or cobalt. Thereafter, a CMP process may be performed to planarize the upper surface of the layer of insulating material 142, which results in the removal of excess portions of the liner and the tungsten (or cobalt) positioned above the layer of insulating material 142 outside of the contact openings 142A, 142B and the formation of the contact structures 150, 152. Note that the gate contact (CB) structure 150 is completely prevented from contacting the recessed portion 130R of the stepped conductive source/drain structures 130S by the silicon nitride recessed spacers 108R, the remaining portions of the silicon dioxide T-shaped gate cap layer 126A and the silicon nitride non-conductive structures 140.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device comprising:
   forming an active region in a semiconductor substrate;
   forming an isolation region, wherein the isolation region surrounds the active region;
   forming a source/drain region on the active region;
   forming a gate structure on the active region;
   wherein a gate length direction is defined along an axial length of said gate structure and a gate width direction is defined in a direction perpendicular to said gate length direction, and extends between said gate structure and said source/drain region;
   forming an initial conductive source/drain structure that is conductively coupled to said source/drain region of said transistor device;
   performing a recess etching process on said initial conductive source/drain structure to thereby define a stepped conductive source/drain structure with a cavity defined therein,
   wherein said stepped conductive source/drain contact structure has a stepped configuration when viewed in cross-sectional view taken through said stepped conductive source/drain contact structure in a direction corresponding to said gate width direction;
   forming a non-conductive structure in said cavity defined in said stepped conductive source/drain structure;
   forming a layer of insulating material above said gate structure, said stepped conductive source/drain structure and said non-conductive structure;
   forming a gate contact opening in said layer of insulating material; and
   forming a conductive gate contact in said gate contact opening that is conductively coupled to said gate structure.

2. The method of claim 1, wherein forming said gate contact opening comprises forming said gate contact opening such that the entire gate contact opening is positioned vertically above said active region.

3. The method of claim 1, wherein forming said gate contact opening comprises forming said gate contact opening such that said gate contact opening is positioned at least partially vertically above said non-conductive structure.

4. The method of claim 1, wherein forming said gate contact opening in said layer of insulating material comprises forming said gate contact opening so as to expose a portion of said non-conductive structure.

5. The method of claim 1, wherein said initial conductive source/drain structure has an initial axial length in said gate width direction of said transistor device and wherein performing said recess etching process comprises performing said recess etching process such that said cavity defined in said stepped conductive source/drain structure has an axial length that is approximately 5-80% of an initial axial length of said initial conductive source/drain structure.

6. The method of claim 1, wherein performing said recess etching process comprises performing said recess etching process such that said stepped conductive source/drain structure has a recessed portion and a non-recessed portion, wherein a thickness of said recessed portion is less than a thickness of said non-recessed portion.

7. The method of claim 6, wherein said recessed portion has a thickness that is approximately 20-70% of said non-recessed portion.

8. The method of claim 1, wherein said transistor device comprises a gate cap layer made of silicon dioxide and wherein forming said non-conductive structure comprises forming said non-conductive structure from a silicon nitride material.

9. The method of claim 1, wherein said transistor device is one of a FinFET transistor device or a planar transistor device.

10. The method of claim 1, wherein said gate structure is comprised of at least one layer of metal.

11. The method of claim 1, wherein said gate contact is comprised of tungsten or copper.

12. The method of claim 1, wherein said initial conductive source/drain structure comprises a metal silicide material and a conductive metal positioned above said metal silicide material.

13. The method of claim 1, wherein said conductive metal is comprised of tungsten.

14. A method of forming a semiconductor device comprising:
   forming an active region in a semiconductor substrate;
   forming an isolation region, wherein the isolation region surrounds the active region;
   forming a source/drain region on the active region;
   forming a gate structure on the active region;
   wherein a gate length direction is defined along an axil length of said gate structure and a gate width direction is defined in a direction perpendicular to said gate length direction, and extends between said gate structure and said source/drain region;
   forming an initial conductive source/drain structure that is conductively coupled to said source/drain region of said transistor device;
   performing a recess etching process on said initial conductive source/drain structure to thereby define a stepped conductive source/drain structure,
   said stepped conductive source/drain structure having a recessed portion and a nonrecessed portion,
   wherein a thickness of said recessed portion is less than a thickness of said non-recessed portion, and said stepped conductive source/drain contact structure has a stepped configuration when viewed in cross-sectional view taken through said stepped conductive source/drain contact structure in a direction corresponding to said gate width direction;
   forming a non-conductive structure above said recessed portion of said stepped conductive source/drain structure;
   forming a layer of insulating material above said gate structure,
   said stepped conductive source/drain structure and said non-conductive structure;
   forming a gate contact opening in said layer of insulating material; and
   forming a conductive gate contact in said gate contact opening that is conductively coupled to said gate structure.

15. The method of claim 14, wherein forming said gate contact opening comprises forming said gate contact opening such that the entire gate contact opening is positioned vertically above said active region.

16. The method of claim 14, wherein forming said gate contact opening comprises forming said gate contact opening such that said gate contact opening is positioned at least partially vertically above said non-conductive structure.

17. The method of claim 14, wherein said initial conductive source/drain structure has an initial axial length in a gate width direction of said device and wherein said recessed portion has an axial length that is approximately 5-80% of said initial axial length of said initial conductive source/drain structure.

18. The method of claim 14, wherein said recessed portion has a thickness that is approximately 20-70% of said non-recessed portion.

19. The method of claim 14, wherein said transistor device comprises a gate cap layer made of silicon dioxide and wherein forming said non-conductive structure comprises forming said non-conductive structure from a silicon nitride material.

20. A method of forming a semiconductor device comprising:
- forming an active region in a semiconductor substrate;
- forming an isolation region, wherein the isolation region surrounds the active region;
- forming a source/drain region on the active region;
- forming a gate structure on the active region;
- wherein a gate length direction is defined along an axial length of said gate structure and a gate width direction is defined in a direction perpendicular to said gate length direction, and extends between said gate structure and said source/drain region;
- forming an initial conductive source/drain structure that is conductively coupled to said source/drain region of said transistor device,
- said initial conductive source/drain structure having an initial axial length in said gate width direction of said transistor device;
- performing a recess etching process on said initial conductive source/drain structure to thereby define a stepped conductive source/drain structure with a cavity defined therein,
- said cavity having an axial length that is approximately 5-80% of said initial axial length of said initial conductive source/drain structure,
- wherein said stepped conductive source/drain contact structure has a stepped configuration when viewed in cross-sectional view taken through said stepped conductive source/drain contact structure in a direction corresponding to said gate width direction;
- forming a non-conductive structure in said cavity defined in said stepped conductive source/drain structure;
- forming a layer of insulating material above said gate structure,
- said stepped conductive source/drain structure and said non-conductive structure;
- forming a gate contact opening in said layer of insulating material so as to expose a portion of said non-conductive structure; and
- forming a conductive gate contact in said gate contact opening that is conductively coupled to said gate structure.

* * * * *

UNITED STATES PATENT AND TRADEMARK OFFICE
CERTIFICATE OF CORRECTION

PATENT NO. : 10,038,065 B2
APPLICATION NO. : 15/639095
DATED : July 31, 2018
INVENTOR(S) : Ruilong Xie et al.

Page 1 of 1

It is certified that error appears in the above-identified patent and that said Letters Patent is hereby corrected as shown below:

In the Claims

Column 14, Line 30 (Claim 14, Line 8), change "axil" to "axial".

Signed and Sealed this
Eighteenth Day of September, 2018

Andrei Iancu
*Director of the United States Patent and Trademark Office*